(12) United States Patent
Kato et al.

(10) Patent No.: US 7,129,122 B2
(45) Date of Patent: Oct. 31, 2006

(54) SEMICONDUCTOR MEMORY CELL AND SEMICONDUCTOR MEMORY DEVICE

(75) Inventors: Kiyoshi Kato, Sagamihara (JP); Atsuo Isobe, Atsugi (JP); Hidekazu Miyairi, Tochigi (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 20 days.

(21) Appl. No.: 10/933,388

(22) Filed: Sep. 3, 2004

(65) Prior Publication Data
US 2005/0136581 A1 Jun. 23, 2005

Related U.S. Application Data

(62) Division of application No. 10/393,768, filed on Mar. 21, 2003, now Pat. No. 6,812,491.

(30) Foreign Application Priority Data
Mar. 22, 2002 (JP) .............................. 2002-080462

(51) Int. Cl.
*H01L 21/84* (2006.01)
*H01L 21/336* (2006.01)

(52) U.S. Cl. ...................... 438/151; 438/164; 438/166; 438/257; 438/487

(58) Field of Classification Search ................ 438/149, 438/151, 164, 166, 482, 486, 487, 257
See application file for complete search history.

(56) References Cited

U.S. PATENT DOCUMENTS

| | | | |
|---|---|---|---|
| 5,747,828 A | 5/1998 | Hata et al. | |
| 5,886,376 A * | 3/1999 | Acovic et al. | 257/316 |
| 5,893,730 A | 4/1999 | Yamazaki et al. | |
| 5,929,479 A * | 7/1999 | Oyama | 257/315 |
| 5,956,581 A * | 9/1999 | Yamazaki et al. | 438/166 |
| 5,965,915 A | 10/1999 | Yamazaki et al. | |
| 6,294,815 B1 | 9/2001 | Yamazaki et al. | |
| 6,326,249 B1 | 12/2001 | Yamazaki et al. | |
| 6,509,217 B1 * | 1/2003 | Reddy | 438/153 |
| 6,635,555 B1 * | 10/2003 | Voutsas | 438/487 |
| 6,930,326 B1 * | 8/2005 | Kato et al. | 257/59 |
| 2002/0004292 A1 | 1/2002 | Yamazaki et al. | |

(Continued)

FOREIGN PATENT DOCUMENTS

JP 2001-144027 5/2001

*Primary Examiner*—T. N. Quach
(74) *Attorney, Agent, or Firm*—Eric J. Robinson; Robinson Intellectual Property Law Office, P.C.

(57) ABSTRACT

An insulating film with a linear concave portion is formed and a semiconductor film is formed thereon by deposition. The semiconductor film is irradiated with laser light to melt the semiconductor film and the melted semiconductor is poured into the concave portion, where it is crystallized. This makes distortion or stress accompanying crystallization concentrate on other regions than the concave portion. A surface of this crystalline semiconductor film is etched away, thereby forming in the concave portion a crystalline semiconductor film which is covered with side walls of the concave portion from the sides and which has no other grain boundaries than twin crystal. TFTs and memory TFTs having this crystalline semiconductor film as their channel regions are highly reliable, have high field effect mobility, and are less fluctuated in characteristic. Accordingly, a highly reliable semiconductor memory device which can operate at high speed is obtained.

22 Claims, 28 Drawing Sheets
(1 of 28 Drawing Sheet(s) Filed in Color)

U.S. PATENT DOCUMENTS

2002/0134981 A1   9/2002  Nakamura et al.
2003/0209710 A1  11/2003  Yamazaki et al.
2003/0219935 A1  11/2003  Miyairi et al.

* cited by examiner

401

401

FIG. 9A
FIG. 9B
FIG. 9C
FIG. 9D
FIG. 9E
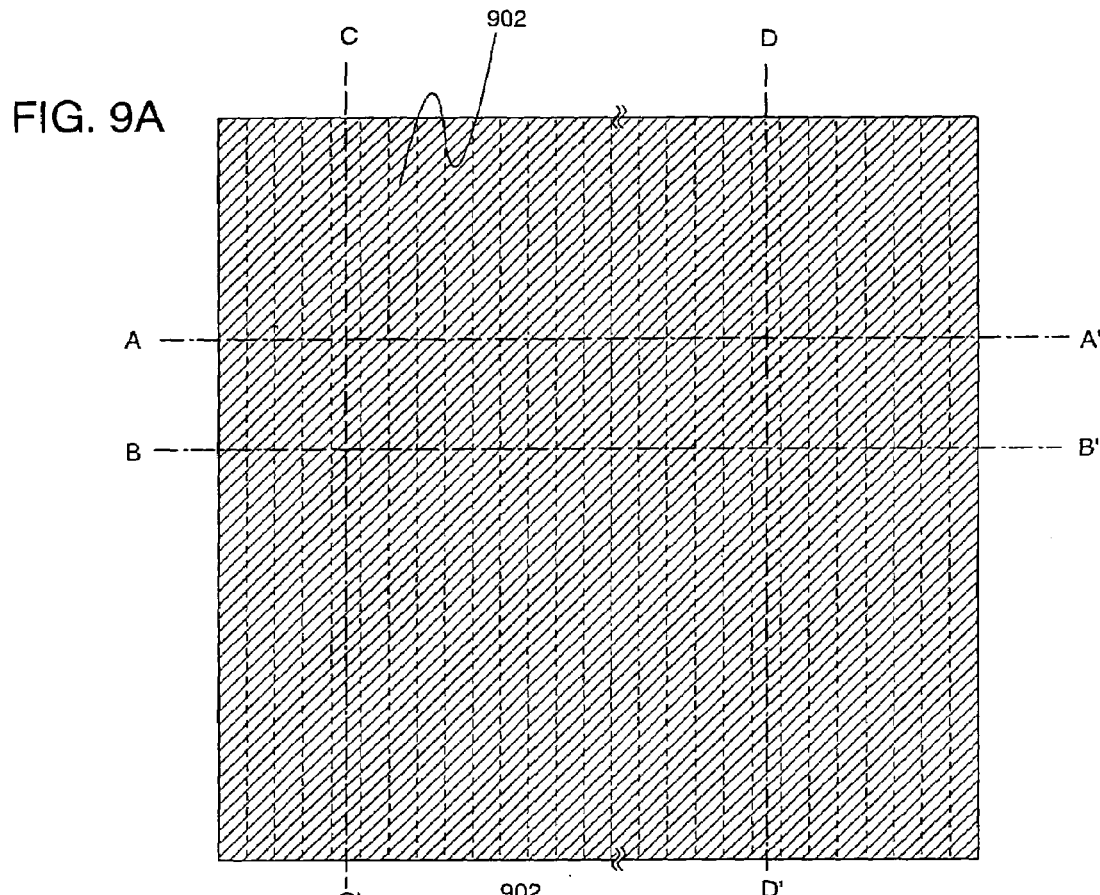
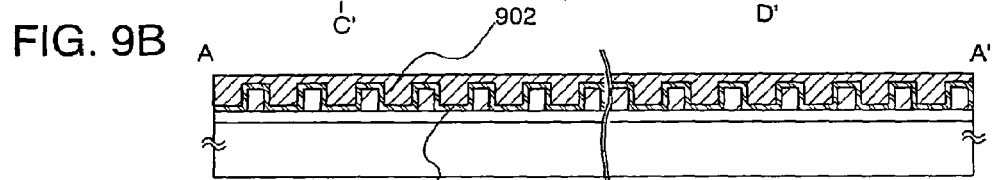
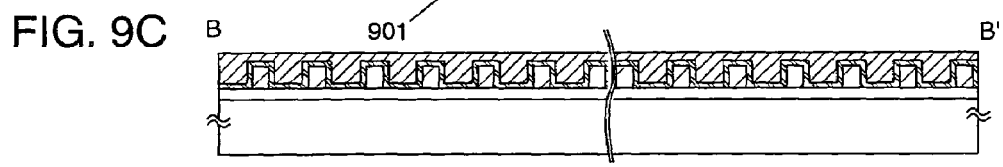
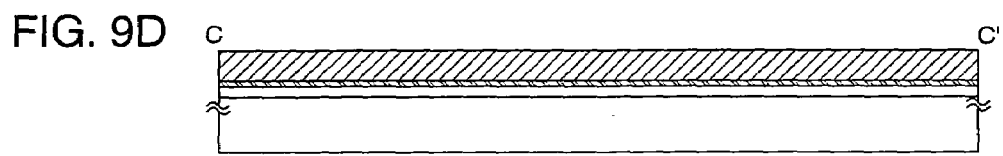
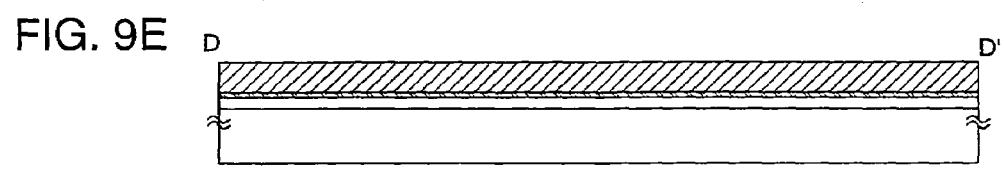

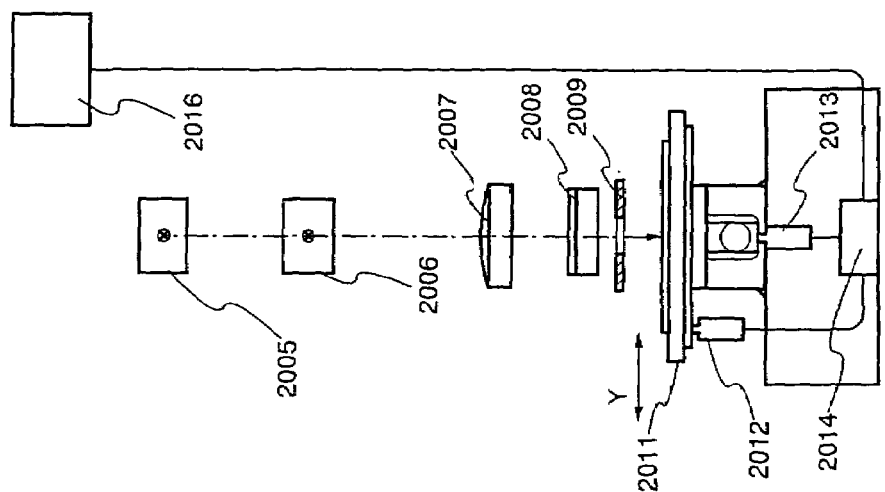
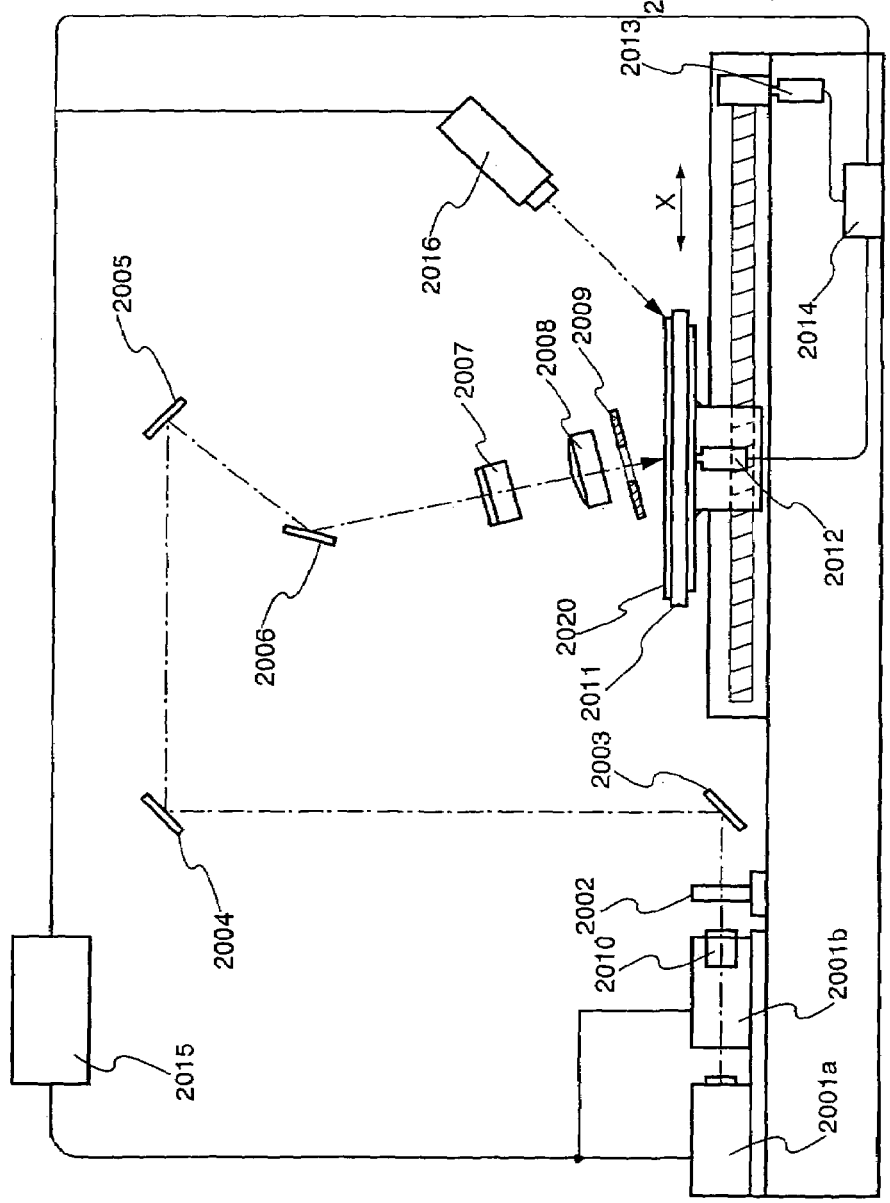
FIG. 20B side view
FIG. 20A front view

2160 power max.
min.

1 µm

⊢────⊣ 1 µm

SEMICONDUCTOR MEMORY CELL AND SEMICONDUCTOR MEMORY DEVICE

BACKGROUND OF THE INVENTION

1. Field of the Invention

The present invention relates to a semiconductor memory cell, specifically, a thin film transistor having an electric charge accumulating layer. The present invention also relates to a semiconductor memory device in which a thin film transistor having an electric charge accumulating layer and a thin film transistor are formed on a substrate having an insulating surface.

2. Description of the Related Art

EEPROM (Electrically Erasable and Programmable Read Only Memory) and flash memory are known as representatives of semiconductor non-volatile memories. Unlike major semiconductor memories such as DRAM (Dynamic Random Access Memory) and SRAM (static RAM), EEPROM and flash memory do not lose data when power is turned off since they are non-volatile. They are also superior to magnetic disc, which is another representative non-volatile memory, in such characteristics as high integration degree, withstandingness against impact, small power consumption, and high writing/reading speed.

Semiconductor non-volatile memories thus have characteristics suitable for portable machines, and their application to portable machines is being developed. In particular, flash memory having high integration degree is widely applied and, recently, multi-valued memories with even higher integration degree have begun to appear on the market. These are of course non-volatile memories on single crystal silicon substrates.

On the other hand, popularization of cellular phones and other portable machines having display units has brought an increasing demand for system on panel in which a display portion and a logic circuit portion are integrally formed on a substrate having an insulating surface. With this trend, techniques for manufacturing a non-volatile memory on a substrate having an insulating surface are now needed.

In manufacturing a non-volatile memory on a substrate having an insulating surface, one conceivable mode is to construct a memory cell array from semiconductor memory cells and use thin film transistors (hereinafter referred to as TFTs) for peripheral circuits such as a decoder circuit for selecting a memory cell and a writing/reading circuit.

The term semiconductor memory cell in the present invention refers to a thin film transistor that has an electric charge accumulating layer surrounded by an insulating film between a semiconductor active layer and a gate electrode. For example, the term covers a thin film transistor having a structure with a floating gate electrode, or an MNOS structure, or an MONOS structure.

For a non-volatile memory as such, important objectives are improvement in reliability of a semiconductor memory cell which is lowered as electric charges are injected to and discharged from its electric charge accumulation layer and improvement of the total operation speed of the memory cell array and the peripheral circuits.

First, regarding the reliability, a semiconductor memory cell has the following structural problem. Shown in FIGS. 2A to 2C are the structure of a typical semiconductor memory cell manufactured on a substrate having an insulating surface. FIG. 2A is a plan view thereof whereas FIGS. 2B and 2C are its sectional view in the channel length direction (sectional view of A–A') and sectional view in the channel width direction (sectional view of B–B'), respectively. In the semiconductor memory cell of FIGS. 2A to 2C, a semiconductor active layer 202, a first gate insulating film 203, a floating gate electrode 204, a second gate insulating film 205, and a control gate electrode 206 are layered on a substrate 201 having an insulating surface. The semiconductor active layer 202 is composed of a channel region 207 and high concentration impurity regions 208 that are doped with an impurity of one conductivity type.

The floating gate electrode 204 is one mode of the electric charge accumulating layer. One of the high concentration impurity regions 208 may partially overlap the floating gate electrode 204 with the first gate insulating film 203 sandwiched therebetween.

In this semiconductor memory cell structure, what causes a problem regarding the reliability is the shape of a semiconductor active layer end 209. With the semiconductor active layer shaped as shown in FIGS. 2A to 2C, the electric field concentrates on a corner of the semiconductor active layer end when the control gate electrode and the active layer have different electric potentials. This causes local injection/discharge of electric charges in the semiconductor active layer end 209. As a result, the first gate insulating film is degraded intensively in the semiconductor active layer end 209 and the reliability is lowered.

In order to prevent local degradation of the first gate insulating film due to the electric field concentration, it is effective to invent a semiconductor memory cell structure that does not have a region where the electric field concentrates as the semiconductor active layer end 209.

As to improvement of the memory operation speed, it is important to manufacture high performance TFTs and semiconductor memory cells on a substrate having an insulating surface.

The technology of forming a TUFT on a substrate having an insulating surface has made great advances mainly through research and development of semiconductor display devices (typically, liquid crystal display devices and EL display devices). For instance, TFTs using polycrystalline silicon films have higher field effect mobility (also called mobility) than TFTs formed from amorphous silicon films and thus have enabled a driving circuit on the same substrate where pixels are formed to control a display portion, which in the past was performed by a driving circuit external to the substrate.

With system on panel looming on horizon, the operation speed has to be increased even more and TFTs of higher performance are demanded.

One of techniques for forming a TUFT on a substrate having an insulating surface that has been attracting attention in recent years is manufacture of a crystalline semiconductor film by laser light irradiation. For laser oscillation apparatus, gas lasers, typically an excimer laser, and solid-state lasers, typically a YAG laser, are usually used. A technique has been disclosed in JP 2001-144027 A in which solid-state laser oscillation apparatus such as a Nd:YVO$_4$, laser is used to irradiate an amorphous semiconductor film with laser light that is its second harmonic, and a crystalline semiconductor film larger in grain size than conventional ones is formed and used to manufacture a TUFT.

However, when an amorphous semiconductor film formed on a flat surface is crystallized by laser light irradiation, the crystal obtained is polycrystal and it is impossible to control neither positions where grain boundaries containing crystal defects are formed nor positions of distortion and cracks caused by volume shrinkage of the semiconductor film, thermal stress with the base, and lattice mismatch which are brought by crystallization.

Therefore, the crystallinity of the channel region of the TUFT cannot be controlled and, in the end, the grain boundaries and crystal defects included in the channel region lead to fluctuation in element characteristic between TFTs.

In short, when using laser light irradiation to form a crystalline semiconductor film, the important objective is to control the crystallinity of a channel region of a TUFT by controlling positions of grain boundaries.

To attain a high speed operation memory, it is important to improve semiconductor memory cell characteristics as well as TUFT characteristics. This is because improvement in TUFT characteristics raise the operation speed of peripheral circuits whereas improvement in semiconductor memory cell characteristics enhances drive performance of semiconductor memory cells, thereby increasing the reading speed.

SUMMARY OF THE INVENTION

The present invention has been made in view of the above-mentioned problems, and an object of the present invention is to provide a high-speed operation semiconductor memory device having a highly reliable non-volatile memory through a TUFT and semiconductor memory cell which have no other grain boundaries than twin crystal in their channel regions, which have high field effect mobility, and which are less fluctuated, by creating a semiconductor memory cell structure that does not allow electric field concentration on an active layer end in a channel region and by controlling positions of grain boundaries and crystal defects and positions of cracks.

A structure of a semiconductor memory cell according to the present invention is characterized in that: the memory cell has, on a substrate having an insulating surface, an insulating film in which linear concave portions are formed; an amorphous semiconductor film or a polycrystalline semiconductor film is formed on the insulating film; the semiconductor film is melted, poured into the concave portions of the insulating film, and crystallized to form a crystalline semiconductor film; a surface of the crystalline semiconductor film is etched away so that the thickness of the crystalline semiconductor film, at least a portion thereof where a channel region is to be formed, is equal to or less than the depth of the concave portions; a first gate insulating film is formed and is in contact with the top face of the crystalline semiconductor film; and a floating gate electrode, a second gate insulating film, and a control gate electrode are formed on the first gate insulating film.

A structure of a semiconductor memory device according to the present invention has a memory cell array that is composed of semiconductor memory cells arranged in matrix, and is characterized in that: the memory cell array has, on a substrate having an insulating surface, an insulating film in which stripe pattern concave portions are formed, the stripe pattern concave portions being plural linear concave portions arranged in a stripe pattern, an amorphous semiconductor film or a polycrystalline semiconductor film is formed on the insulating film; the semiconductor film is melted, poured into the concave portions of the insulating film, and crystallized to form a crystalline semiconductor film; a surface of the crystalline semiconductor film is etched away so that the thickness of the crystalline semiconductor film, at least a portion thereof where a channel region is to be formed, is equal to or less than the depth of the concave portions; unnecessary regions of the crystalline semiconductor film are etched away in accordance with arrangement of the semiconductor memory cells; a first gate insulating film is formed and is in contact with the top face of the crystalline semiconductor film; and a floating gate electrode, a second gate insulating film, and a control gate electrode are formed on the first gate insulating film.

Another structure of a semiconductor memory device according to the present invention has a memory cell array that is composed of semiconductor memory cells arranged in matrix, and is characterized in that: the memory cell array has, on a substrate having an insulating surface, an insulating film in which stripe pattern concave portions and inter-stripe concave portions are formed, the stripe pattern concave portions being plural linear concave portions arranged in a stripe pattern, the inter-stripe concave portions connecting the stripe pattern concave portions with one another; an amorphous semiconductor film or a polycrystalline semiconductor film is formed on the insulating film; the semiconductor film is melted, poured into the concave portions of the insulating film, and crystallized to form a crystalline semiconductor film; a surface of the crystalline semiconductor film is etched away so that the thickness of the crystalline semiconductor film, at least a portion thereof where a channel region is to be formed, is equal to or less than the depth of the concave portions; unnecessary regions of the crystalline semiconductor film are etched away in accordance with arrangement of the semiconductor memory cells and connection between the semiconductor memory cells; a first gate insulating film is formed and is in contact with the top face of the crystalline semiconductor film; and a floating gate electrode, a second gate insulating film, and a control gate electrode are formed on the first gate insulating film. In this structure, semiconductor film wires for connecting the semiconductor memory cells are formed from crystalline semiconductor films that are in the inter-stripe concave portions.

Another structure of a semiconductor memory device according to the present invention has a memory cell array that is composed of semiconductor memory cells arranged in matrix, and is characterized in that: the memory cell array has, on a substrate having an insulating surface, an insulating film in which stripe pattern concave portions are formed, the stripe pattern concave portions being plural linear concave portions arranged in a stripe pattern; an amorphous semiconductor film or a polycrystalline semiconductor film is formed on the insulating film; the semiconductor film is melted, poured into the concave portions of the insulating film, and crystallized to form a crystalline semiconductor film; a surface of the crystalline semiconductor film is etched away while a region to become semiconductor film wires for connecting the semiconductor memory cells is masked with a photoresist so that the thickness of the crystalline semiconductor film, at least a portion thereof where a channel region is to be formed, is equal to or less than the depth of the concave portions; unnecessary regions of the crystalline semiconductor film are etched away in accordance with arrangement of the semiconductor memory cells and semiconductor film wires for connecting the semiconductor memory cells; a first gate insulating film is formed and is in contact with the top face of the crystalline semiconductor film; and a floating gate electrode, a second gate insulating film, and a control gate electrode are formed on the first gate insulating film. In this structure, semiconductor film wires for connecting the semiconductor memory cells are formed from crystalline semiconductor films climbing over the inter-stripe concave portions without being etched.

The term semiconductor memory device refers to non-volatile memories such as EEPROM (Electrically Erasable and Programmable Read Only Memory) and flash memory as well as semiconductor devices in general that have these non-volatile memories as their semiconductor memory units. For example, the term includes microprocessors and semiconductor display devices (typically liquid crystal display devices and EL display devices) which have non-volatile memories as their semiconductor memory units, and apparatus to which the microprocessors and the semiconductor display devices are mounted.

An amorphous semiconductor film in the present invention includes, in addition to one that has a thoroughly-amorphous structure in a strict sense, one with microcrystal grains mixed, namely, a microcrystalline semiconductor film, and a semiconductor film with a localized crystal structure. Typically, an amorphous silicon film is employed. An amorphous silicon germanium film, an amorphous silicon carbide film or the like may be employed instead. A polycrystalline silicon film is the one obtained by crystallizing one of these amorphous semiconductor films by a known method.

Shown in FIGS. 1A to 1C are a typical structure of a semiconductor memory cell that constitutes the above-described semiconductor memory device of the present invention. FIG. 1A is a plan view thereof whereas FIGS. 1B and 1C are its sectional view in the channel length direction (sectional view of A–A') and sectional view in the channel width direction (sectional view of B–B'), respectively. In the semiconductor memory cell of FIGS. 1A to 1C, a crystalline semiconductor active layer 102, a first gate insulating film 103, a floating gate electrode 104, a second gate insulating film 105, and a control gate electrode 106 are layered on a substrate 101 having an insulating surface. The crystalline semiconductor active layer 102 is formed in a linear concave portion defined by insulating films 109 and 110. The crystalline semiconductor active layer 102 is composed of a channel region 107 and high concentration impurity regions 108 that are doped with an impurity of one conductivity type.

One of the high concentration impurity regions 108 may partially overlap the floating gate electrode 104 with the first gate insulating film 103 sandwiched therebetween.

A semiconductor memory cell of the present invention is characterized in that side faces of a portion of a crystalline semiconductor film that forms a channel region are completely covered with side walls of a concave portion through a step of removing by etching a surface of the crystalline semiconductor film so that the thickness of the crystalline semiconductor film, at least the portion thereof that forms a channel region, is equal to or less than the depth of the concave portion.

As shown in FIGS. 1A to 1C, the crystalline semiconductor active layer may be thinner than the insulating films 109 and 110 or may be as thick as the insulating films 109 and 110.

The above semiconductor memory cell has in section no corner in the interface between the semiconductor active layer and the first gate insulating film and the interface is flat. Accordingly, this semiconductor memory cell is free from the problem of electric field concentration on a semiconductor active layer end which causes local injection/discharge of electric charges. As a result, local degradation of the first gate insulating film can be avoided and high reliability is obtained.

The semiconductor memory device described above may have, on a substrate where memory cells are formed, peripheral circuits such as a decoder circuit for selecting a memory cell and a reading/writing circuit, and other semiconductor integrated circuits. In this case, a crystalline semiconductor film formed by the above-described method is preferably used for TFTs that constitute the peripheral circuits and other semiconductor integrated circuits in order to increase the operation speed of the memory.

The method of forming a crystalline semiconductor film is described furthermore.

The above-described linear concave portion is one of stripe pattern concave portions, and stretches in the channel length direction. The width of the concave portion (corresponding to the channel width in a channel formation region) is equal to or more than 0.01 μm and equal to or less than 2 μm, preferably, 0.1 to 1 μm. The depth of the concave portion is equal to or more than 0.01 μm and equal to or less than 3 μm, preferably, 0.1 μm or more and 2 μm or less.

Employed for a measure to melt and crystallize the crystalline semiconductor film is pulse oscillation or continuous wave laser light from gas laser oscillation apparatus or solid-state laser oscillation apparatus as a light source. The laser light is collected by an optical system into a linear shape before irradiation, and may have such intensity distribution that is uniform in a region in the longitudinal direction while varied in the lateral direction. The laser oscillation apparatus used as the light source is rectangular beam solid-state laser oscillation apparatus, and slab laser oscillation apparatus is particularly preferred.

Laser light or intense light collected into a linear shape and expanded in the longitudinal direction irradiates the amorphous semiconductor film or polycrystalline semiconductor film while the laser light irradiation position and the substrate on which the semiconductor film is formed are moved in a relative manner. By running the laser light over a part of, or the entire surface of the semiconductor film in this way, the semiconductor film is melted and then crystallized or re-crystallized. The laser light scanning direction is parallel to the linear concave portion formed in the insulating film or matches the channel length direction of the transistor. This makes crystals grow along the laser light scanning direction, thereby preventing grain boundaries from crossing the channel length direction.

By setting the depth of the concave portion equal to or more than the thickness of the semiconductor film, the semiconductor melted by irradiation of laser light or intense light gathers in the concave portion through surface tension and solidifies. At this point, crystals are let grow from a bottom edge of the concave portion to make distortion that accompanies crystallization concentrate on other regions than the concave portion. This saves a portion of the crystalline semiconductor film that fills the concave portion from the distortion. The rest of the crystalline semiconductor film, which remains around the concave portion and which contains grain boundaries and crystal defects, is removed by etching.

The semiconductor memory cell manufactured as above has, in a linear concave portion formed on an insulating surface, a crystalline semiconductor film that contains no other grain boundaries than twin crystal.

The present invention described above makes it possible to specify locations of channel formation regions of semiconductor memory cells and TFTs and form crystalline semiconductor films that contain no other grain boundaries than twin crystal in the channel regions. This means that the crystallinity of the channel regions of the TFTs and semiconductor memory cells can be controlled and improved, thereby giving high field effect mobility to the semiconductor memory cells and TFTs and making them less fluctuated in characteristic. Improvement of TUFT characteristics increases the operation speed of peripheral circuits and improvement of semiconductor memory cell characteristic increases the reading speed. As a result, a semiconductor memory device that can operate at high speed is obtained.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

In the accompanying drawings:

FIGS. 9A to 9E are a top view and sectional views illustrating a method of manufacturing a semiconductor memory device in accordance with the present invention;

FIGS. 20A and 20B are arrangement diagrams showing one mode of laser irradiation apparatus employed in the present invention;

DETAILED DESCRIPTION OF THE PREFERRED EMBODIMENTS

Embodiment Mode 1

A circuit structure and operation method of a non-volatile memory will be described as an embodiment mode of a semiconductor memory device of the present invention.

Features of the present invention are in the structure of a semiconductor memory cell and its semiconductor active layer and in the structure and semiconductor active layers of TFTs that constitute peripheral circuits. For the circuit structure and operation method of a memory cell, known techniques are used. This embodiment mode gives a brief description on the circuit structure and operation method of a NOR flash memory as a typical non-volatile memory.

Figure 7:
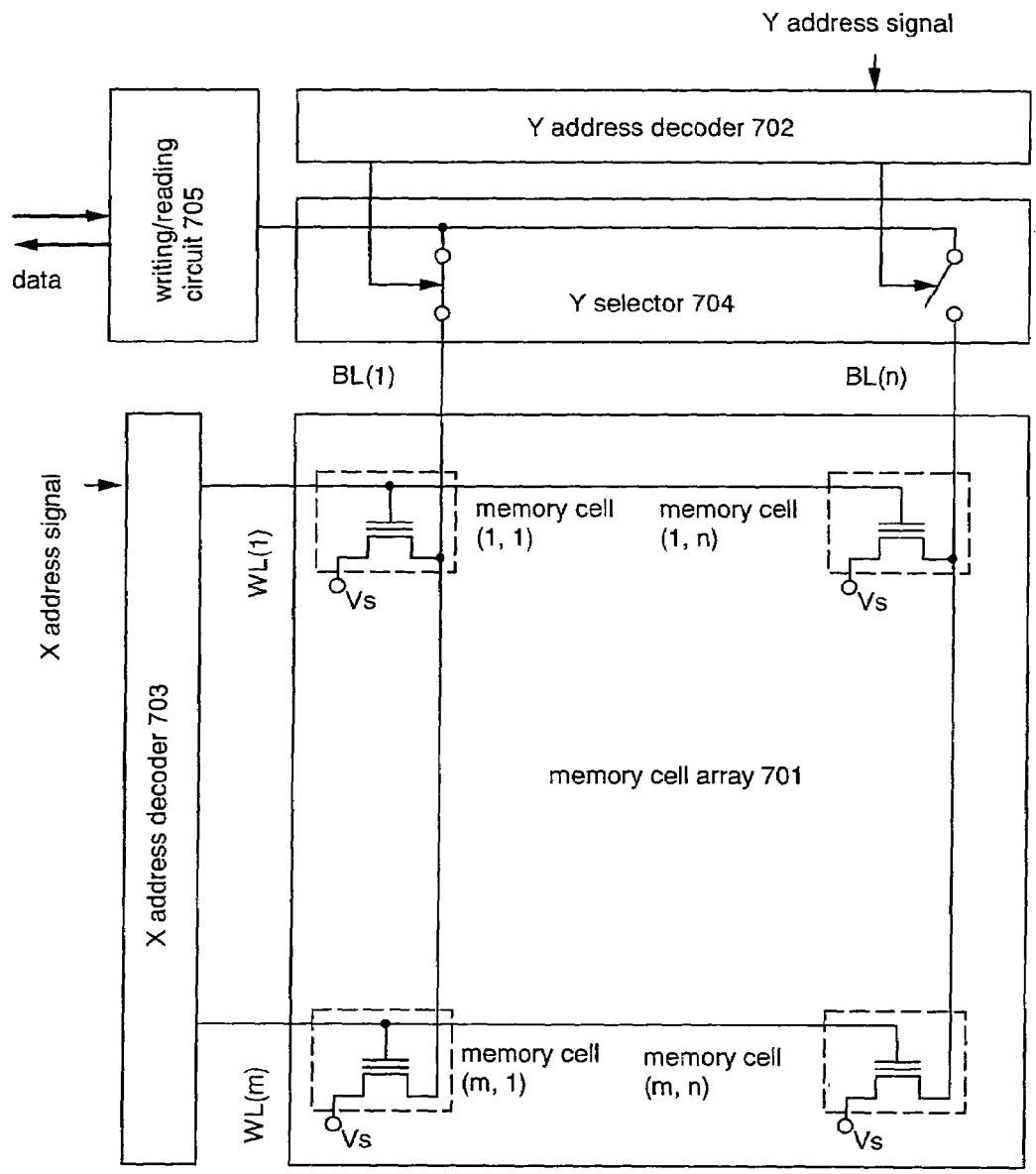
FIG. 7 is a block circuit diagram of a NOR non-volatile memory.
Figure 8A:
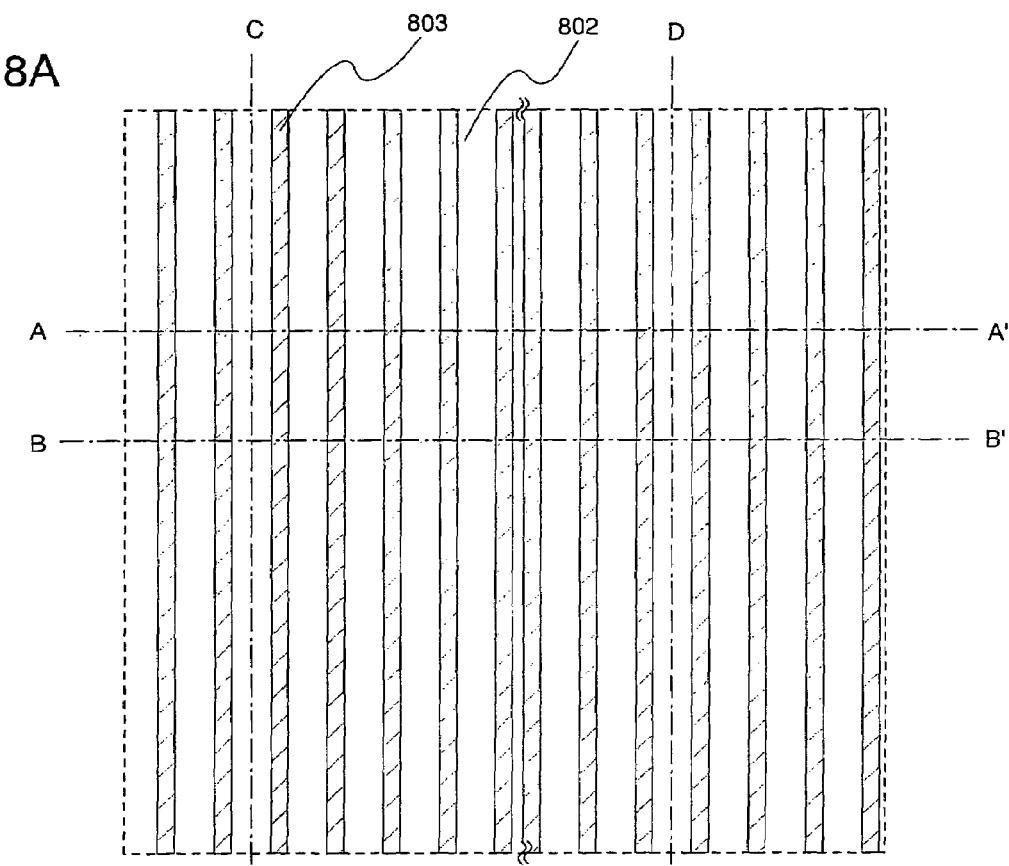
FIGS. 8A to 8E are a top view and sectional views illustrating a method of manufacturing a semiconductor memory device in accordance with the present invention.
Figure 8B:
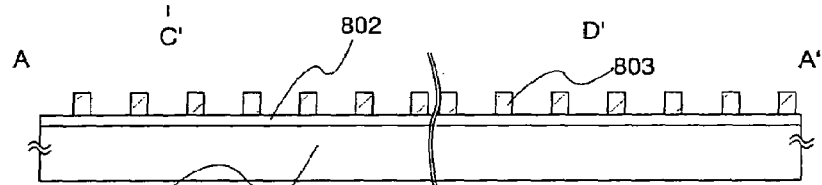
Figure 8C:
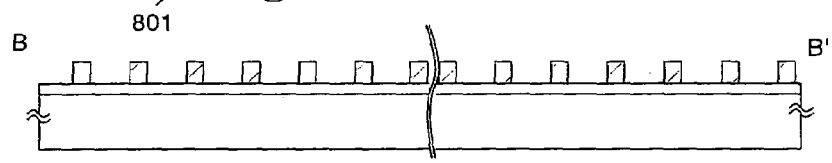
Figure 8D:
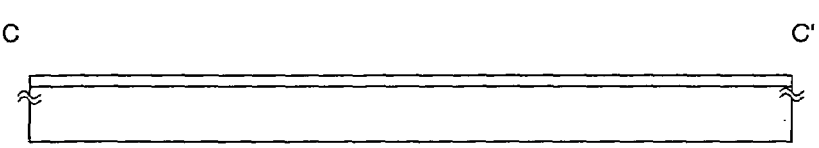
Figure 8E:
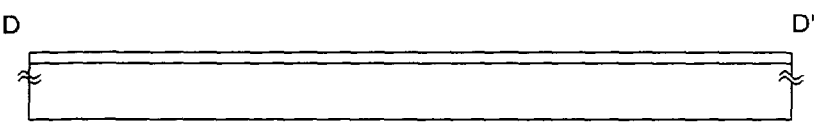
Figure 10A:
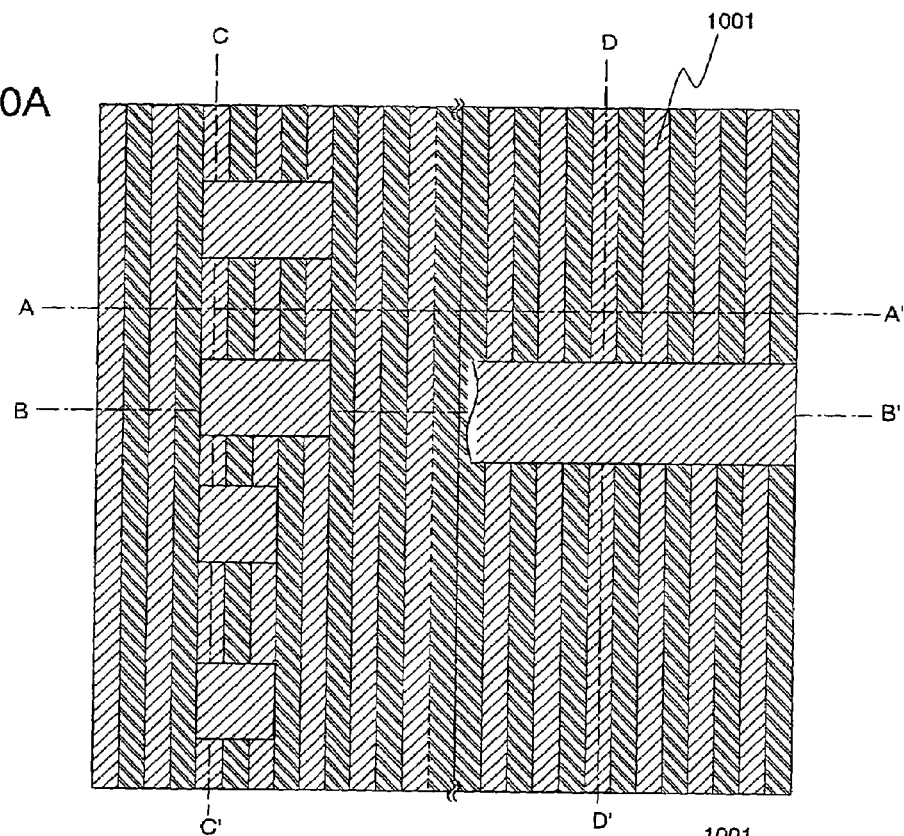
FIGS. 10A to 10E are a top view and sectional views illustrating a method of manufacturing a semiconductor memory device in accordance with the present invention.
Figure 10B:
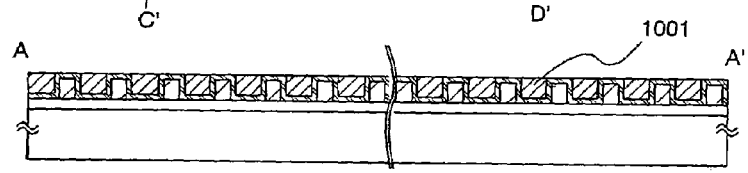
Figure 10C:
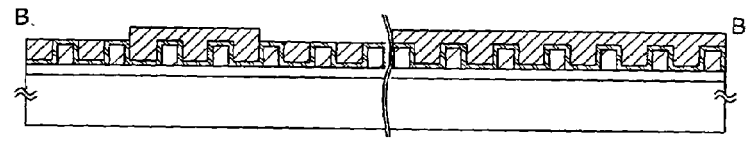
Figure 10D:
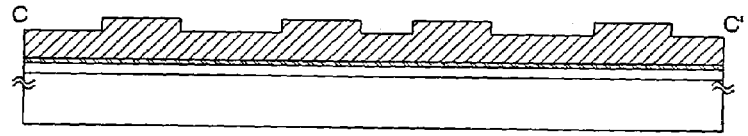
Figure 10E:
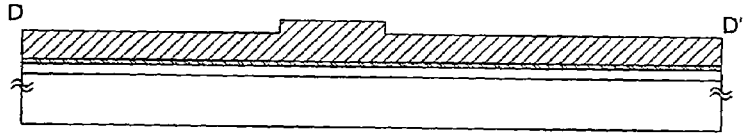
Figure 11A:
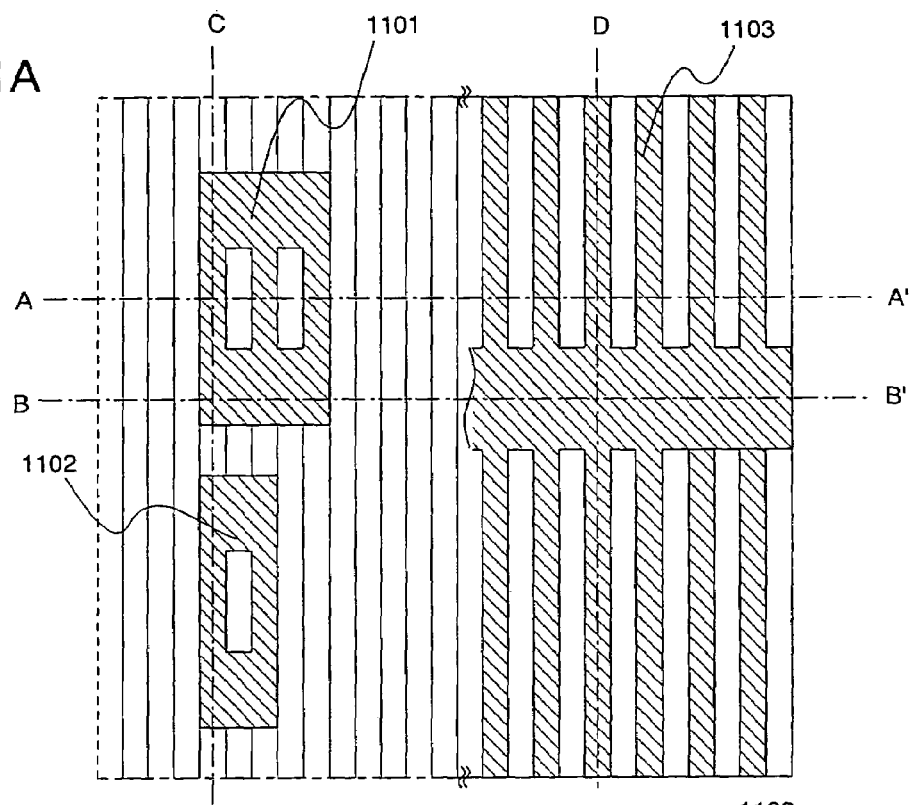
FIGS. 11A to 11E are a top view and sectional views illustrating a method of manufacturing a semiconductor memory device in accordance with the present invention.
Figure 11B:
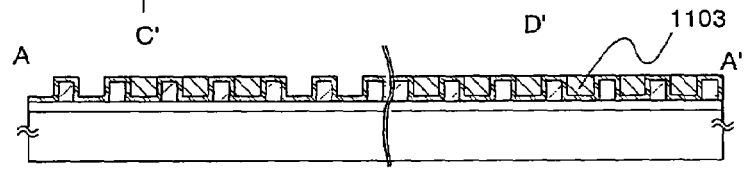
Figure 11C:
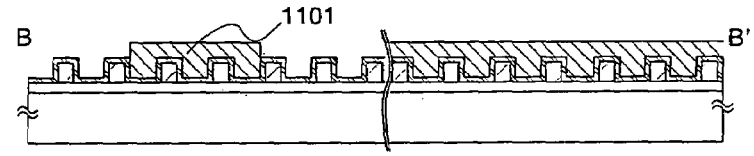
Figure 11D:
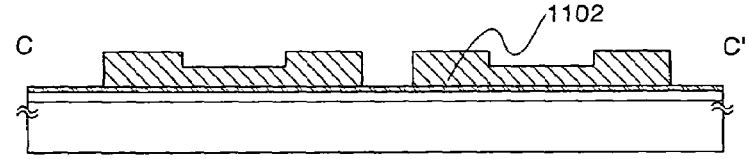
Figure 11E:
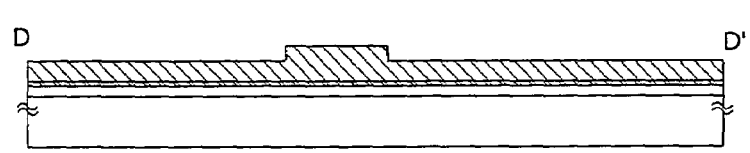
Figure 12A:
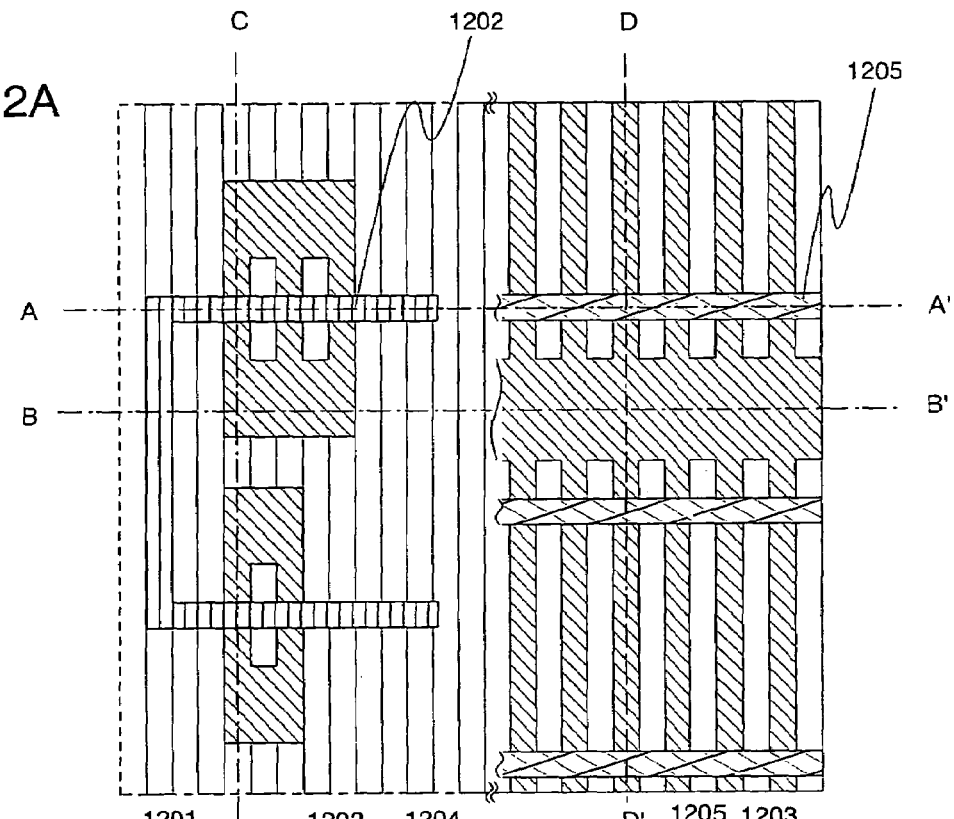
FIGS. 12A to 12E are a top view and sectional views illustrating a method of manufacturing a semiconductor memory device in accordance with the present invention.
Figure 12B:
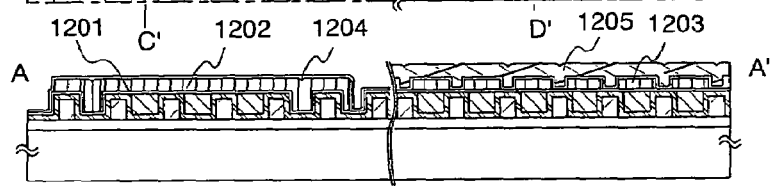
Figure 12C:
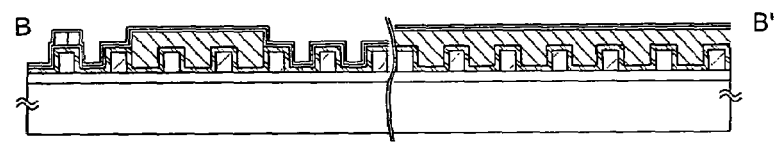
Figure 12D:
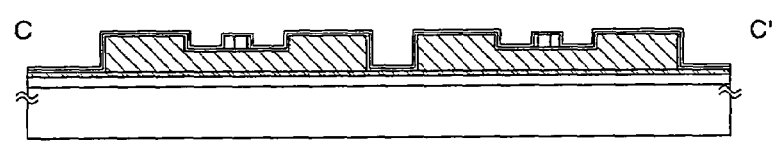
Figure 12E:
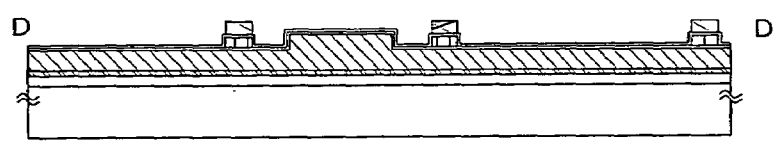
Figure 13A:
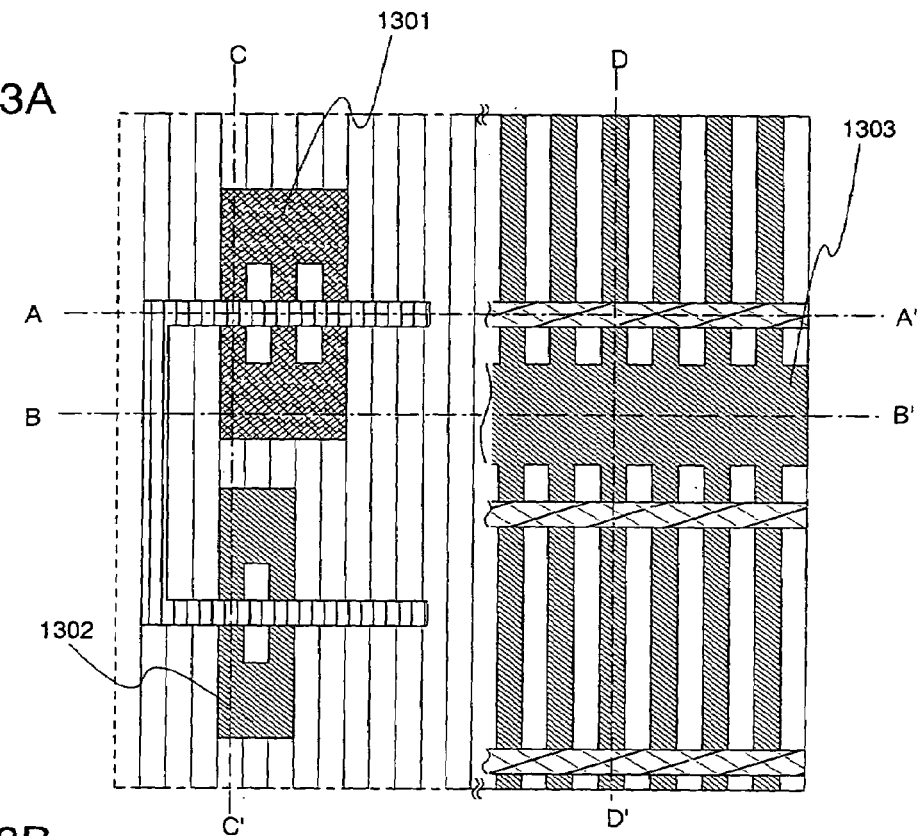
FIGS. 13A to 13E are a top view and sectional views illustrating a method of manufacturing a semiconductor memory device in accordance with the present invention.
Figure 13B:
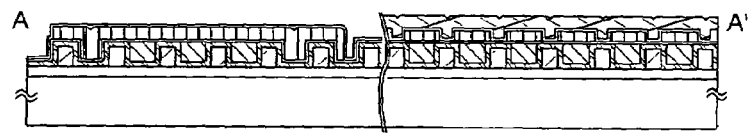
Figure 13C:
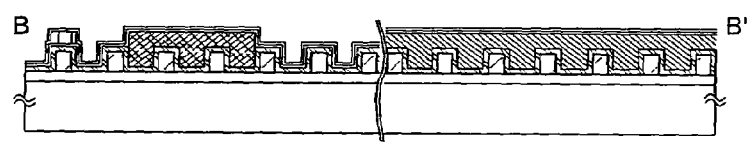
Figure 13D:
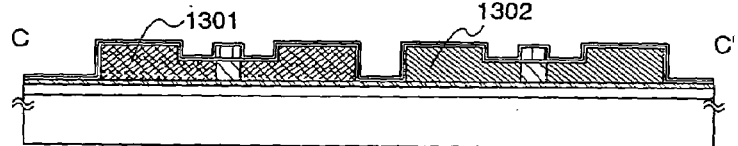
Figure 13E:
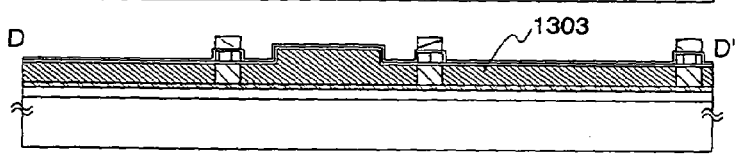
Figure 14A:
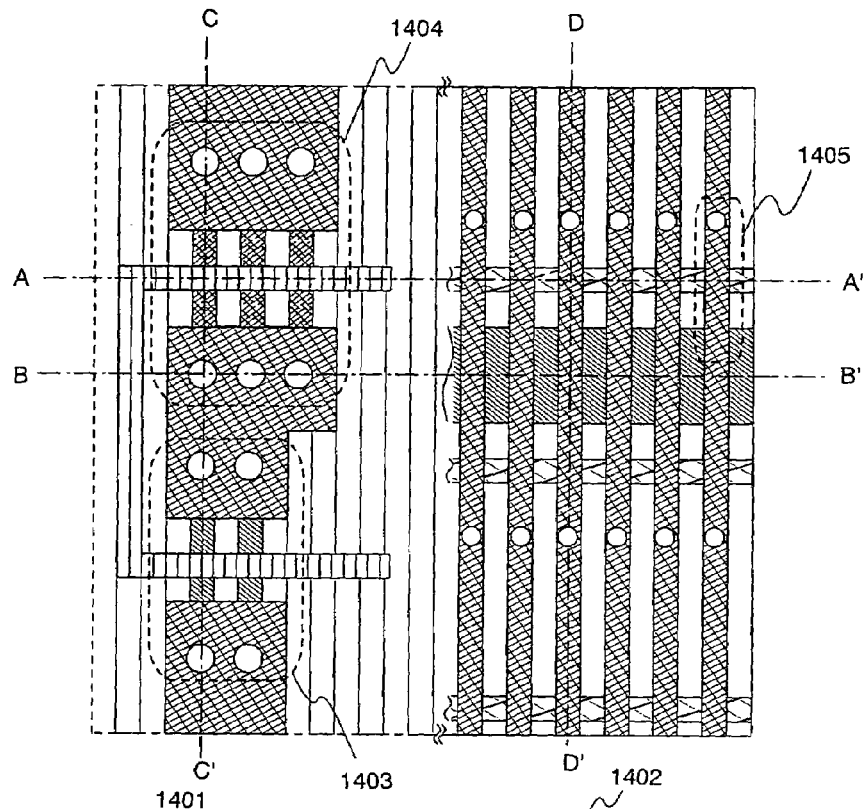
FIGS. 14A to 14E are a top view and sectional views illustrating a method of manufacturing a semiconductor memory device in accordance with the present invention.
Figure 14B:
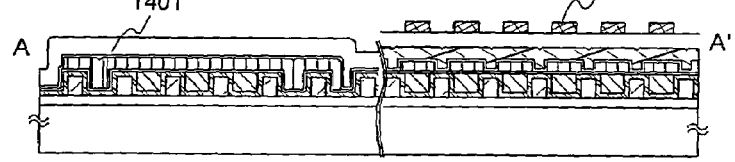
Figure 14C:
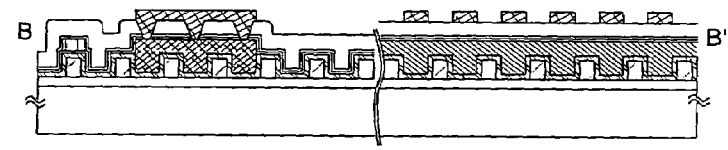
Figure 14D:
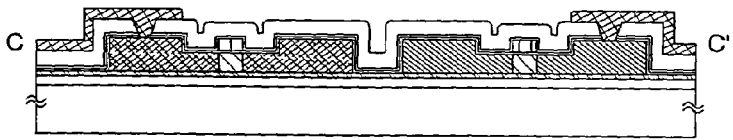
Figure 14E:
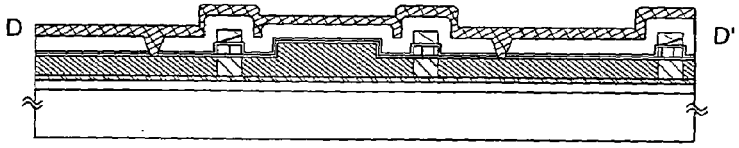
Figure 15A:
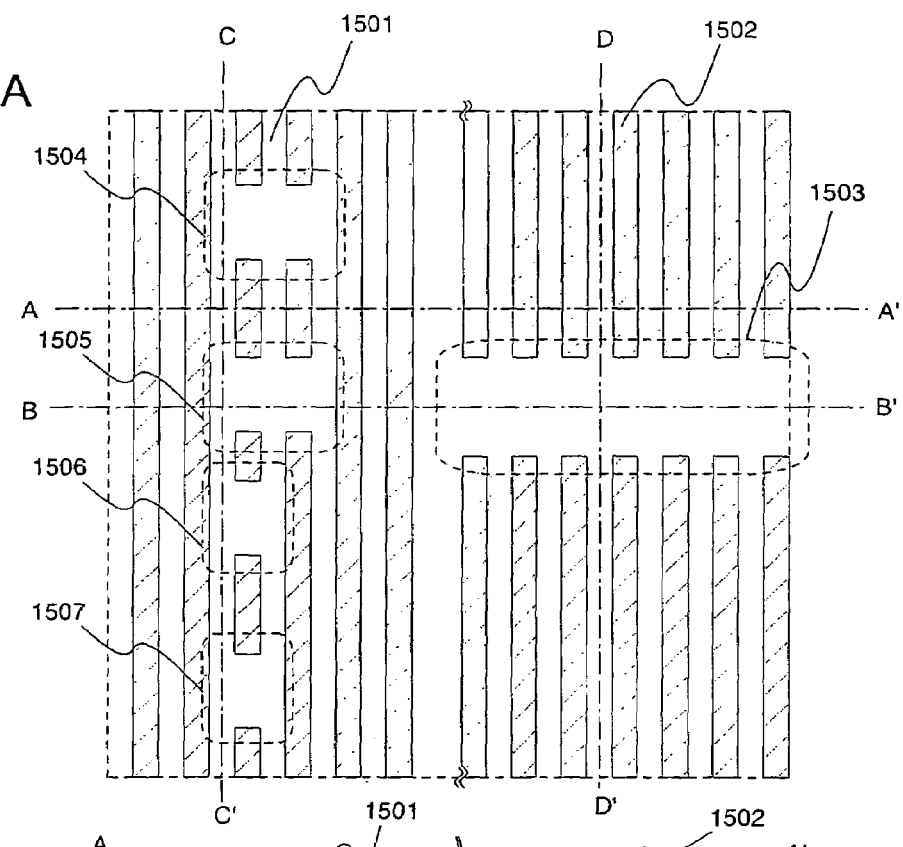
FIGS. 15A to 15E are a top view and sectional views illustrating a method of manufacturing a semiconductor memory device in accordance with the present invention.
Figure 15B:
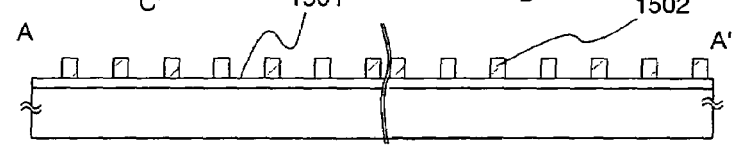
Figure 15C:
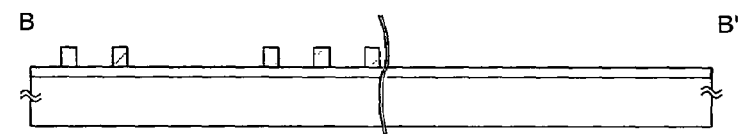
Figure 15D:
Figure 15E:
Figure 16A:
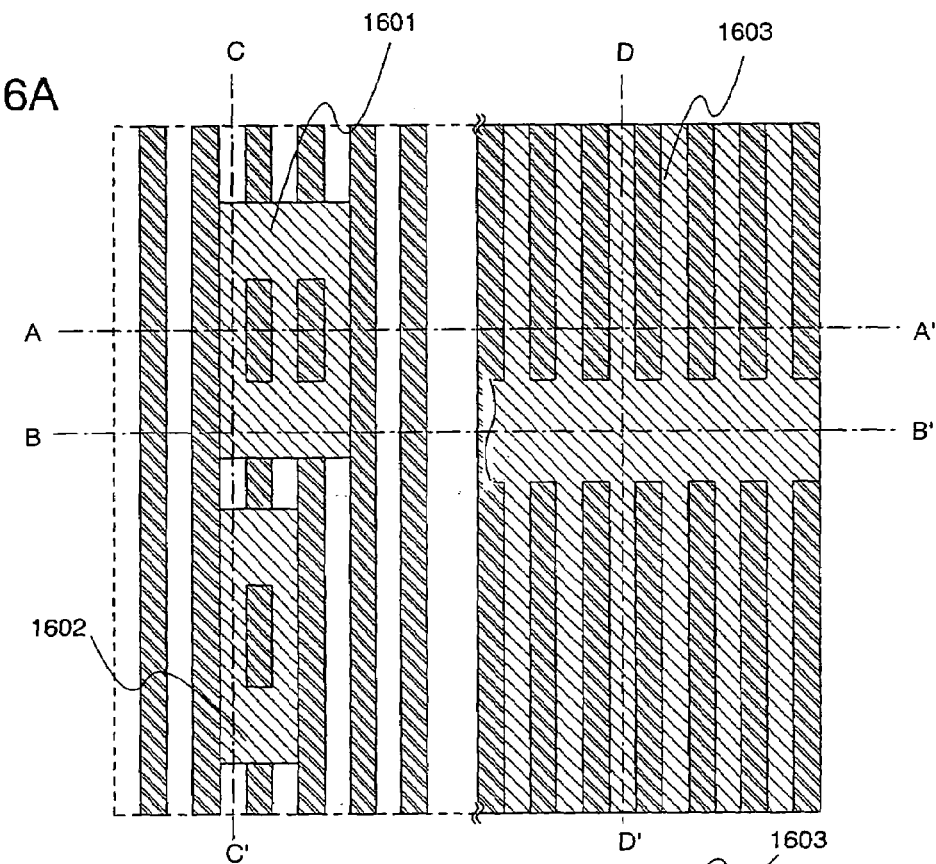
FIGS. 16A to 16E are a top view and sectional views illustrating a method of manufacturing a semiconductor memory device in accordance with the present invention.
Figure 16B:
Figure 16C:
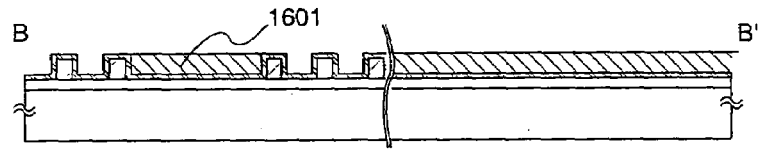
Figure 16D:
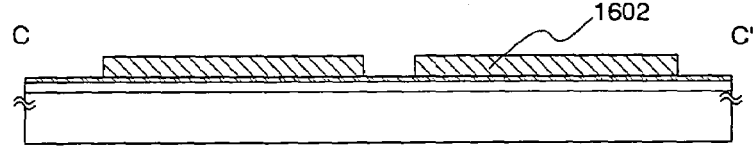
Figure 16E:
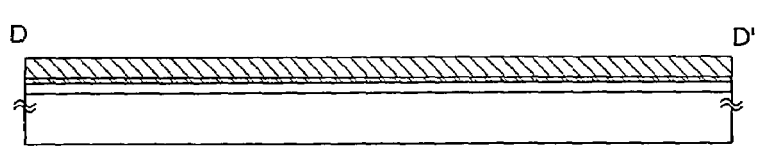
Figure 17A:
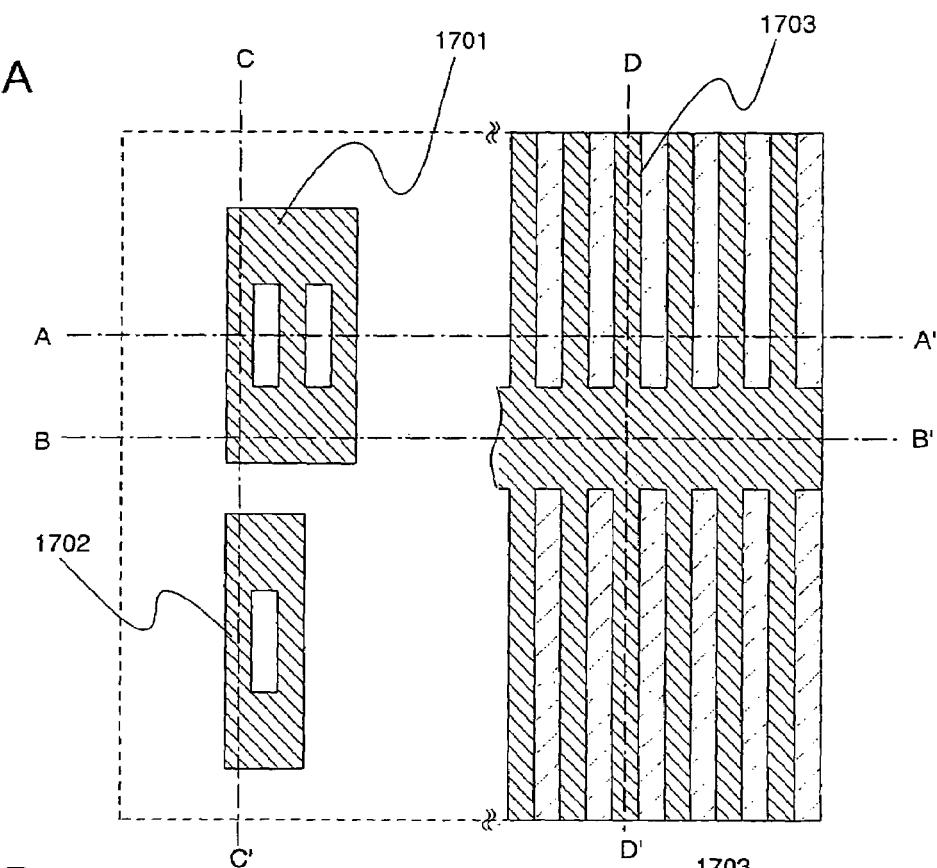
FIGS. 17A to 17E are a top view and sectional views illustrating a method of manufacturing a semiconductor memory device in accordance with the present invention.
Figure 17B:
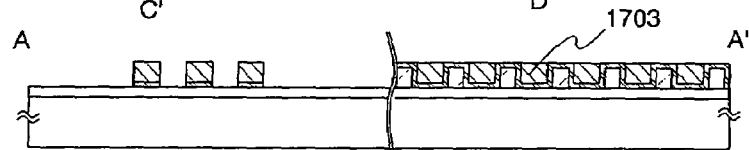
Figure 17C:
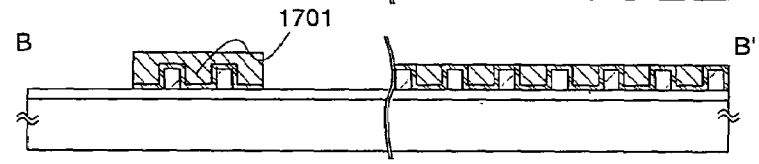
Figure 17D:
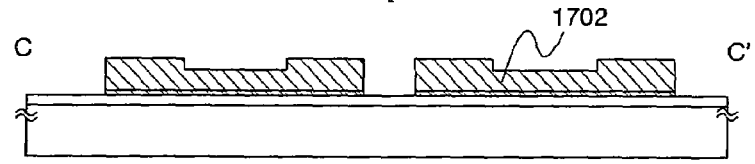
Figure 17E:
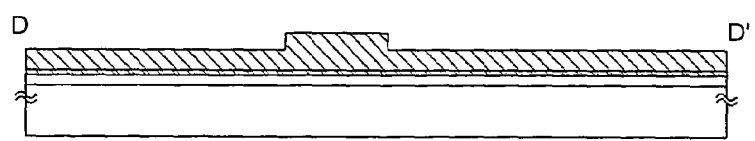
Figure 18A:
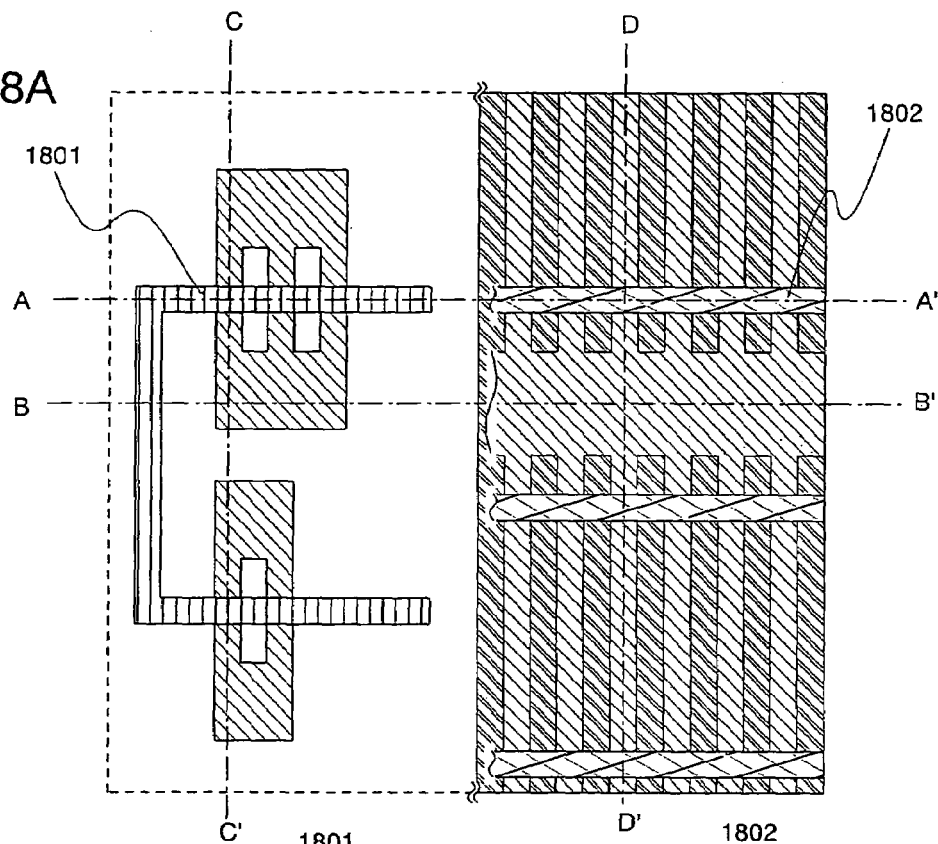
FIGS. 18A to 18E are a top view and sectional views illustrating a method of manufacturing a semiconductor memory device in accordance with the present invention.
Figure 18B:
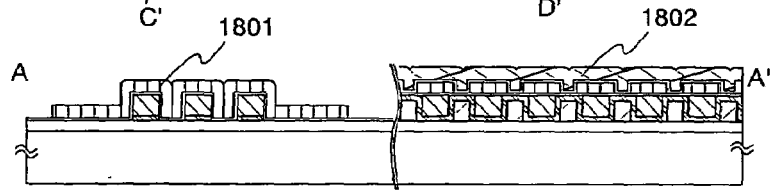
Figure 18C:
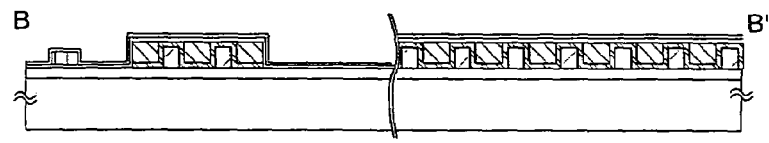
Figure 18D:
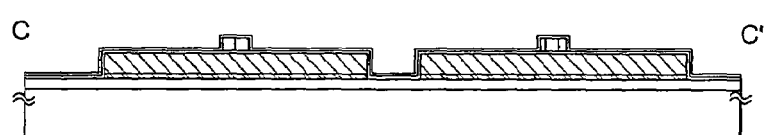
Figure 18E:
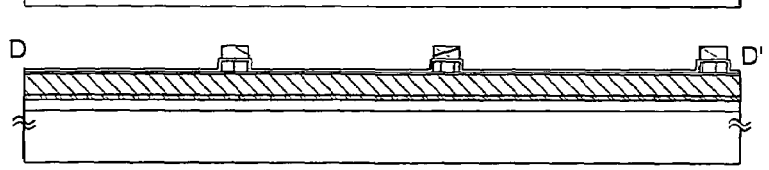

FIG. 7 is a block circuit diagram of a NOR flash memory having a storage capacity of m×n bits: The NOR flash memory shown in FIG. 7 is composed of a memory cell array 701 and peripheral circuits including an X address decoder 703, a Y address decoder 702, a Y selector 704, and a writing/reading circuit 705. The memory cell array 701 has plural memory cells (1, 1) to (n, m), which are arranged into a matrix pattern with m memory cells in column and n memory cells in row. Other peripheral circuits that the NOR flash memory can have include a booster circuit and an address buffer circuit.

Each memory cell (the memory cell (i, j) is described as a representative of the rest of the memory cells. Here, i is an integer equal to or larger than 1 and equal to or smaller than n, whereas j is an integer equal to or larger than 1 and equal to or smaller than m.) is an n-channel semiconductor memory cell. A drain electrode and control gate electrode of the semiconductor memory cell are connected to a bit line BL(i) and a word line WL(j), respectively. Bit lines BL(1) to BL(n) are connected to the Y address decoder 702. Word lines WL(1) to WL(m) are connected to the X address decoder 703. Source electrodes of all of the semiconductor memory cells are connected to a common source line and receive a source line electric potential Vs.

Data are written in and read from memory cells selected by the X address decoder 703 and the Y address decoder 702. The writing operation and reading operation by hot electrons will be described taking the memory cell (1, 1) as an example.

First, when data is written in the semiconductor memory cell, the electric potential of the source line is dropped to GND and a high positive voltage (for example, 16 V) is applied to the bit line BL(1) and the word line WL(1). Under such conditions, impact ionization takes place because of high electric field in the vicinity of the drain of the semiconductor memory cell. High electric field is also generated in the gate direction and resultant hot electrons are injected into the floating gate electrode, thereby starting writing. The threshold voltage of the semiconductor memory cell changes in accordance with the amount of electric charges accumulated in the floating gate electrode.

When data stored in the semiconductor memory cell is read out, the electric potential of the source line is dropped to GND and a given voltage is applied to the word line WL(1). The given voltage is set between the threshold voltage of when electric charges are accumulated in the floating gate electrode of the semiconductor memory cell and the threshold voltage of when no electric charges are accumulated in the floating gate electrode. By setting so, a semiconductor memory device whose floating gate electrode has electric charges accumulated therein is turned OFF whereas a semiconductor memory device whose floating gate electrode has no electric charges accumulated therein is turned ON. This is utilized to read data stored in the memory cell (1, 1) through the bit line BL(1).

For example, if the threshold voltage of a semiconductor memory device in one state is 2 V or lower whereas the threshold voltage of the semiconductor memory device in the other state is 4 V or higher, the given voltage can be 3 V.

Data are erased from the selected plural memory cells simultaneously. For instance, in the case of erasing data of the first column memory cells (1, 1) to (m, 1), the electric potentials of the source line and word line WL(1) are dropped to GND and a high positive voltage (e.g., 20 V) is applied to the bit line BL(1). This causes a great electric potential difference between the gates and drains of the semiconductor memory cells, and therefore electrons accumulated in the floating gate electrodes are released to the drain regions by a tunnel current to erase the data. When electric charges are pulled from a drain region of a semiconductor memory cell in this way, a high concentration impurity region on the drain side preferably overlaps with a part of a floating gate electrode with a first gate insulating film sandwiched therebetween.

The electric potentials of the signal lines BL(2) to BL(n) and WL(2) to WL(m) which are not selected during this writing, reading, and erasing are all set to 0 V. The operation voltage value given in the above is merely an example, and is not to limit the present invention.

The description given in this embodiment mode deals with a case where binary (1 bit) information is stored in one semiconductor memory cell. However, the device may be a multi-valued non-volatile memory that stores ternary information or more in one semiconductor memory cell. Also, the present invention is not limited to a NOR flash memory and can similarly be applied to a NAND flash memory and an AND flash memory. Alternatively, the device may be a non-volatile memory whose memory cell is composed of one semiconductor memory cell plus one selecting TUFT, or a non-volatile memory whose memory cell is a split-gate structured semiconductor memory cell that doubles as a selecting TFT.

Embodiment Mode 2

Figure 1A:
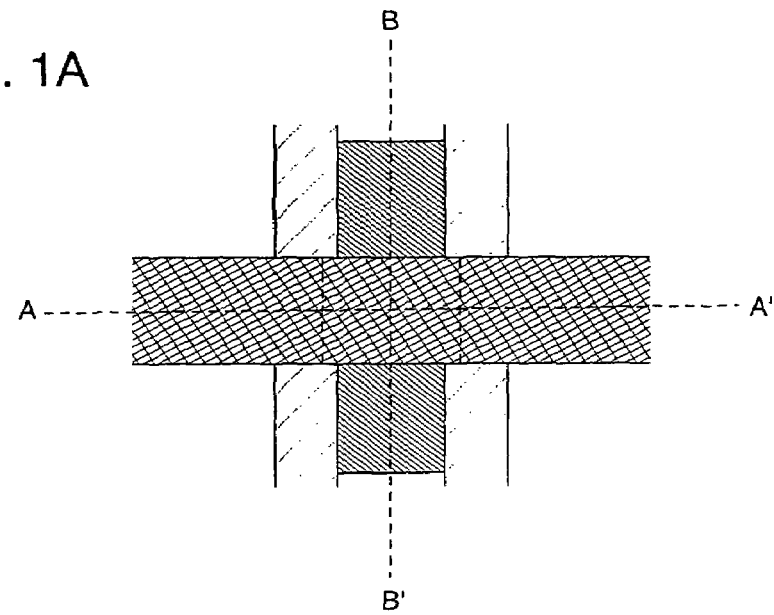
FIGS. 1A to 1C are a top view and sectional views of a semiconductor memory cell of the present invention.
Figure 1B:
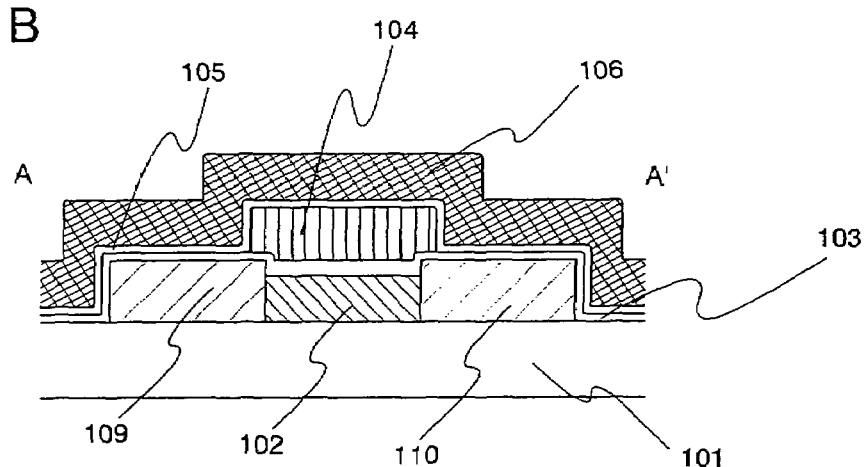
Figure 1C:
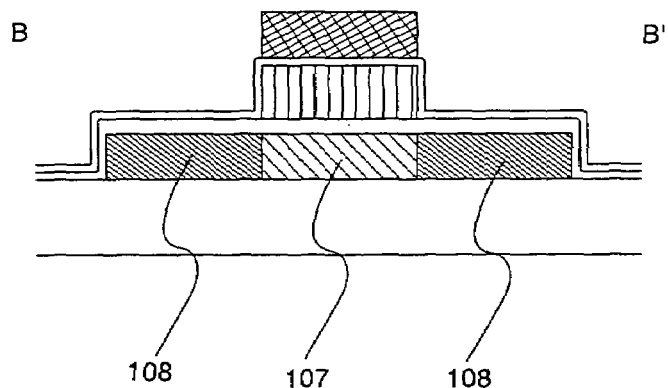
Figure 2A:
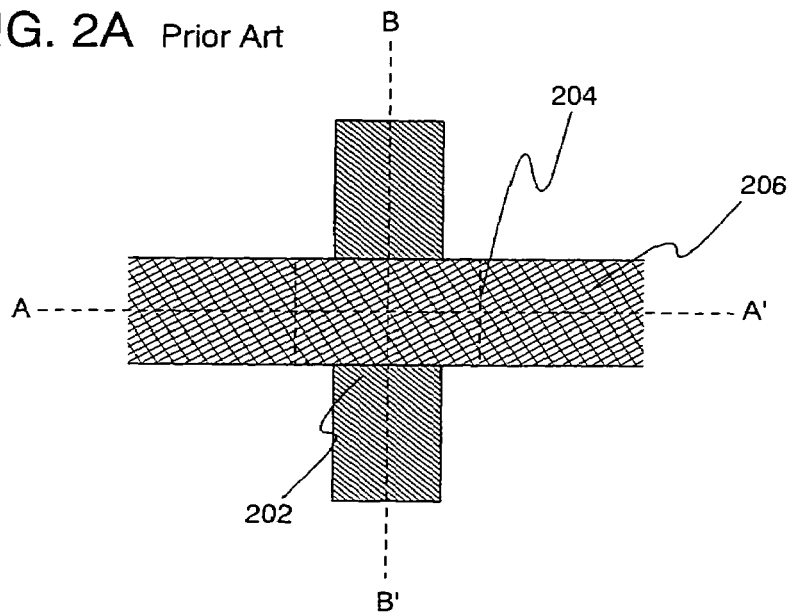
FIGS. 2A to 2C are a top view and sectional views of a conventional semiconductor memory cell.
Figure 2B:
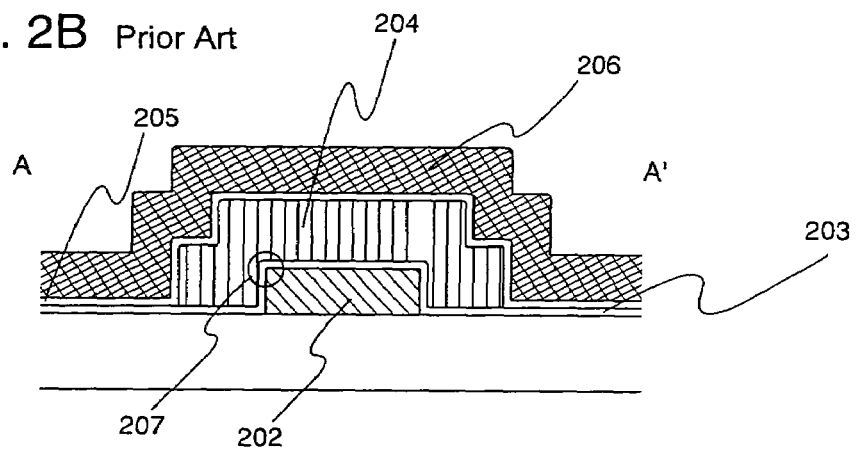
Figure 2C:
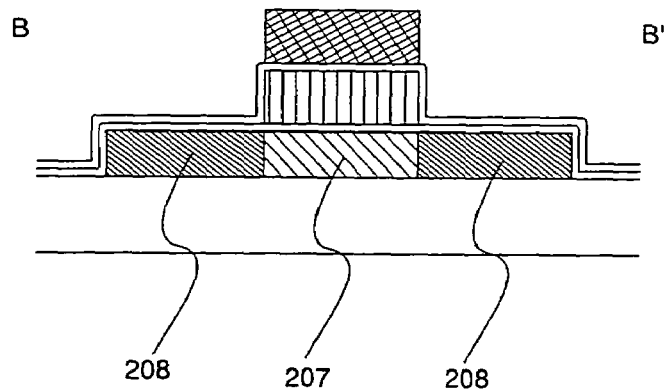
Figure 3A:
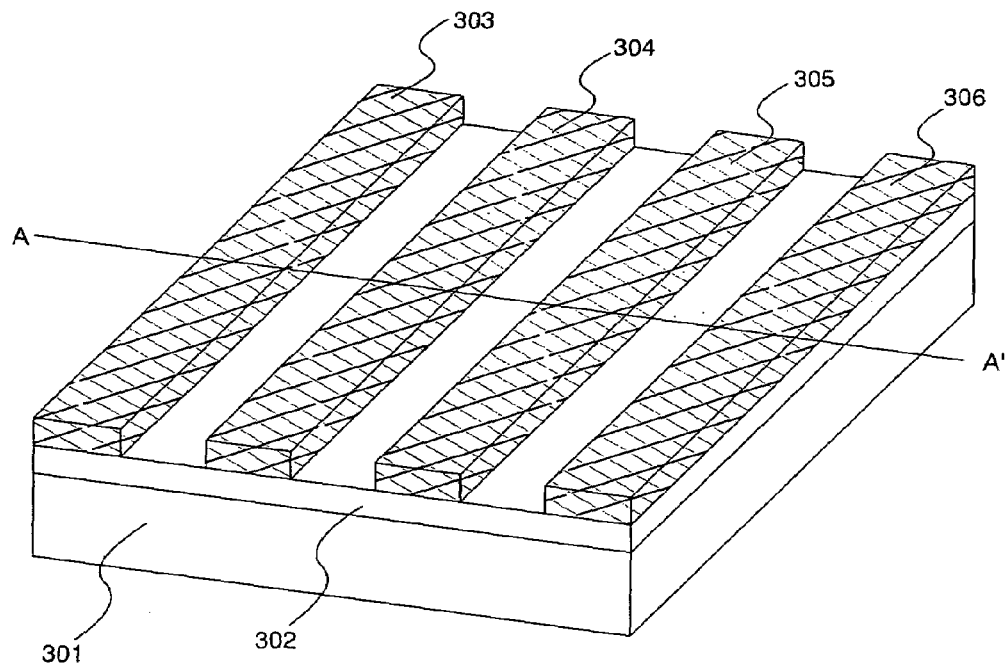
FIGS. 3A and 3B are perspective views illustrating a crystallization method of the present invention.
Figure 3B:
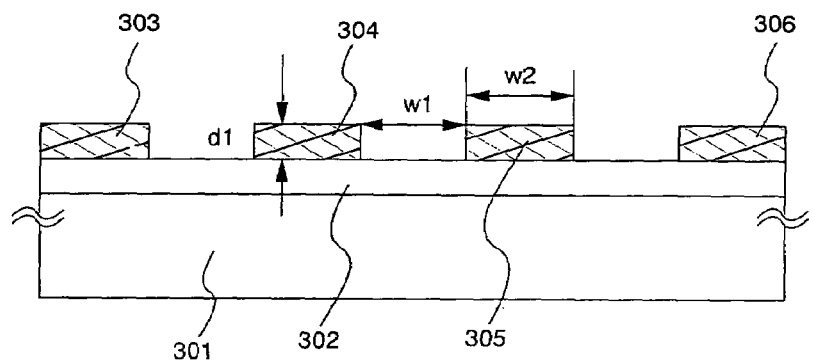

A method of forming a crystalline semiconductor film in the present invention will be described. The description is given with reference to FIGS. 3A to 6B. In perspective views of FIGS. 3A and 3B, a first insulating film 302 and second insulating films 303 to 306 form stripe pattern concave portions on a substrate 301. Although FIGS. 3A and 3B show three linear concave portions, the number of linear concave portions is not limited thereto.

The substrate employed is a commercially-available non-alkaline glass substrate, quartz substrate, sapphire substrate, or single crystal or polycrystal semiconductor substrate with its surface covered with an insulating film. Alternatively, a metal substrate with its surface covered with an insulating film may be employed.

To form the stripe pattern concave portions with a sub-micron level design rule, it is necessary to reduce unevenness on the substrate surface and warpage or contortion of the substrate down to the depth of focus of exposure apparatus (especially stepper) or less. Therefore, unevenness on the substrate surface and warpage and contortion of the substrate are desirably 1 µm or less, more desirably 0.5 µm or less in an area that is exposed by one exposure.

The second insulating films 303 to 306 are each 0.1 to 10 µm (preferably 0.5 to 1 µm) in width W2. An interval W1 between adjacent second insulating films is 0.01 to 2 µm (preferably 0.1 to 1 µm). A thickness d1 of each second insulating film is 0.01 to 3 µm (preferably 0.1 to 2 µm). The stripe pattern may not always follow a regular cycle and the interval between stripes may be varied in accordance with the widths of island-like semiconductor films. The length of the linear concave portions is not limited. For example, a linear concave portion is long enough to form a channel region of a TFT.

The first insulating film is formed to a thickness of 30 to 300 nm from a material selected from the group consisting of silicon nitride, silicon oxynitride in which the nitrogen content is larger than the oxygen content, aluminum nitride, and aluminum oxynitride. The second insulating films forming concave portions of a given shape are made of silicon oxide or silicon oxynitride and their thickness d1 is 10 to 3000 nm, preferably 100 to 2000 nm. A silicon oxide film can be obtained by plasma CVD (Chemical Vapor Deposition) using a mixture of tetraethyl ortho silicate (TEOS) and $O_2$. A silicon oxynitride film is formed by plasma CVD from $SiH_4$, $NH_3$, and $N_2O$, or from $SiH_4$ and $N_2O$, as raw materials.

In forming the linear stripe pattern from two layers of insulating films as shown in FIGS. 3A and 3B, the first and second insulating films have to have a selective ratio during etching. Desirably, materials and film forming conditions are suitably adjusted to give the second insulating films an etching rate faster than that of the first insulating film. The insulating films are etched using buffer hydrofluoric acid, or through dry etching using $CHF_3$. In the etching, the angle of the side faces of the concave portions formed from the second insulating films is suitably set between 5° and 120°, preferably, 80° and 100°.

Although the first and second insulating films form the concave-convex shape of the base on which a crystalline semiconductor film is to be formed in the example shown here, the present invention is not limited to this mode and it can be replaced by other methods as long as the same shape is obtained. For instance, the concave-convex shape may be obtained by directly forming concave portions on a surface of a quartz substrate through etching treatment.

Figure 4A:
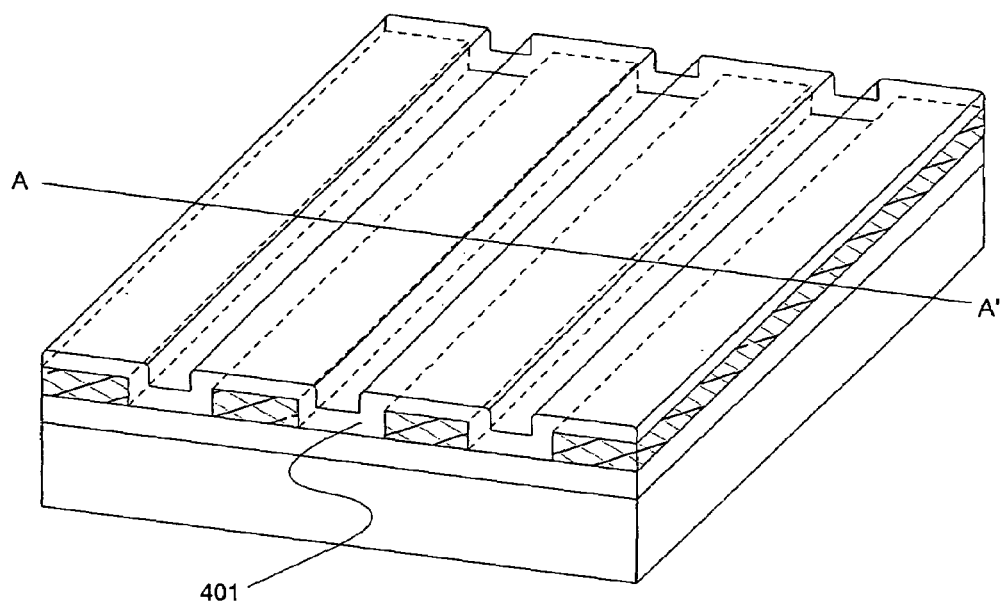
FIGS. 4A and 4B are perspective views illustrating a crystallization method of the present invention.
Figure 4B:
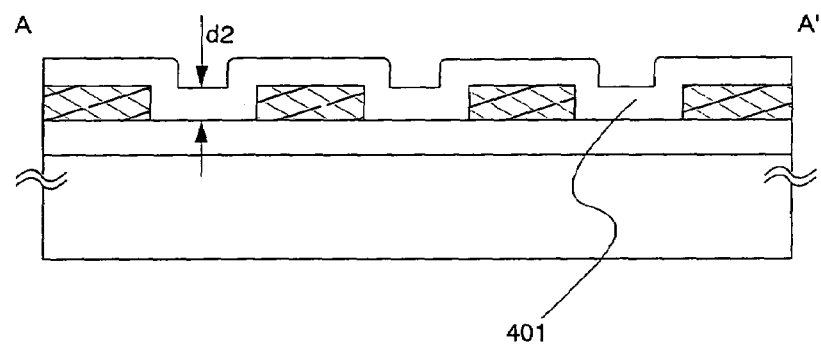

A semiconductor film 401 is formed from silicon, a compound or alloy of silicon and germanium, or a compound or alloy of silicon and carbon to a thickness of 0.01 to 3 µm (preferably 0.1 to 1 µm) as shown in FIGS. 4A and 4B. In other words, a thickness d2 of the semiconductor film 401 is set equal to or more than the depth of the concave portions formed from the second insulating films. The semiconductor film 401 is an amorphous semiconductor film or polycrystalline semiconductor film formed by plasma CVD, sputtering, or reduced pressure CVD, or a polycrystalline semiconductor film formed by solid-phase growth. As shown in the drawings, the semiconductor film 401 is formed so as to cover the concave-convex structure created by the first insulating film and the second insulating film which serve as the base. In order to remove influence of chemical contamination caused by boron or the like adhered to the surfaces of the first and second insulating films and to avoid direct contact between the insulating surface and the amorphous semiconductor film, a silicon oxynitride film is formed as a third insulating film immediately before the amorphous semiconductor film is formed using the same film forming apparatus without exposing the films to the air.

The semiconductor film 401 is melted in an instant and crystallized. In crystallization, the semiconductor film is irradiated with laser light or light radiated from a lamp light source after the light is collected by an optical system to have an energy density enough to melt the semiconductor film. In this step, laser light emitted from continuous wave laser oscillation apparatus is particularly preferable. The laser light used is collected into a linear shape and expanded in the longitudinal direction by an optical system. The laser light desirably has such intensity distribution that is uniform in a region in the longitudinal direction while varied in the lateral direction.

The laser oscillation apparatus used is rectangular beam solid-state laser oscillation apparatus, and slab laser oscillation apparatus is particularly preferable. A slab material used is a crystal such as Nd:YAG, Nd:GGG (gadolinium gallium garnet), or Nd:GsGG (gadolinium scandium gallium garnet). Laser light of a slab laser travels along a zigzag light path in this plate-like laser medium repeating total reflection. Alternatively, solid-state laser oscillation apparatus using a rod doped with Nd, Tm, or Ho may be employed. Specifically, it is a combination of a slab structure amplifier and solid-state laser oscillation apparatus using a crystal such as YAG, YVO$_4$, YLF, or YAlO$_3$ doped with Nd, Tm, or Ho.

Taking into consideration the absorption coefficient of the semiconductor film, the wavelength of the continuous wave laser light is desirably 400 to 700 nm. Light of this wavelength band is obtained by picking up the second harmonic or third harmonic of the fundamental wave through a wavelength converting element. Employable wavelength converting elements are ADP (ammonium dihydrogen phosphate), Ba$_2$NaNb$_5$O$_{15}$ (barium sodium niobate), CdSe (cadmium selenium), KDP (kalium dihydrogen phosphate), LiNbO$_3$ (lithium niobate), Se, Te, LBO, BBO, KB$_5$, etc. LBO is particularly desirable. In a typical example, the second harmonic (532 nm) of Nd:YVO$_4$ laser oscillation apparatus (fundamental wave: 1064 nm) is used. The laser oscillation mode employed is the single mode that is the TEM$_{00}$ mode.

Alternatively, the semiconductor film may be irradiated with intense light equivalent to the laser light. For example, light radiated from a halogen lamp, a xenon lamp, a high-pressure mercury lamp, a metal halide lamp, or an excimer lamp is collected by a mirror reflector, a lens or the like to obtain light of high energy density.

In the case of silicon, which is chosen as the most suitable material, a region where the absorption coefficient is $10^3$ to $10^4$ cm$^{-1}$ is mostly in the visible light range. When crystallizing an amorphous semiconductor film that is formed of silicon to a thickness of 30 to 200 nm on a substrate formed of glass or other substance highly transmissive of visible light, the semiconductor film can be selectively heated and crystallized without damaging the base insulating film by irradiation of visible light having a wavelength of 400 to 700 nm. Specifically, the penetration length of light having a wavelength of 532 nm in an amorphous silicon film is about 100 nm to 1000 nm, and therefore the light can reach the inside of the 30 to 200 nm thick amorphous semiconductor film sufficiently. This means that the semiconductor film can be heated from the inside and that nearly the entire semiconductor film in the laser light irradiation region can be heated uniformly.

Figure 5A:
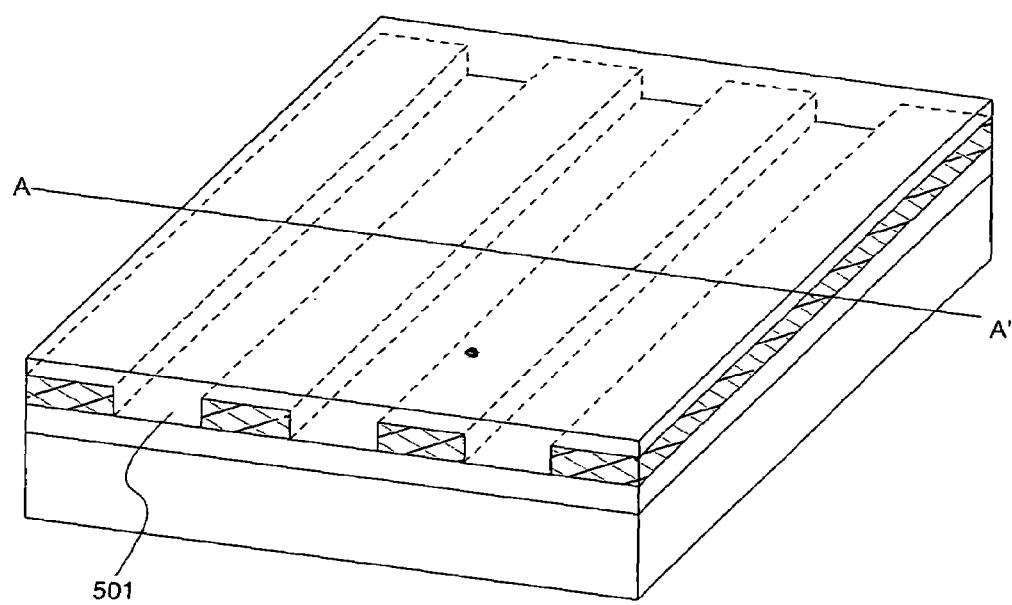
FIGS. 5A and 5B are perspective views illustrating a crystallization method of the present invention.
Figure 5B:
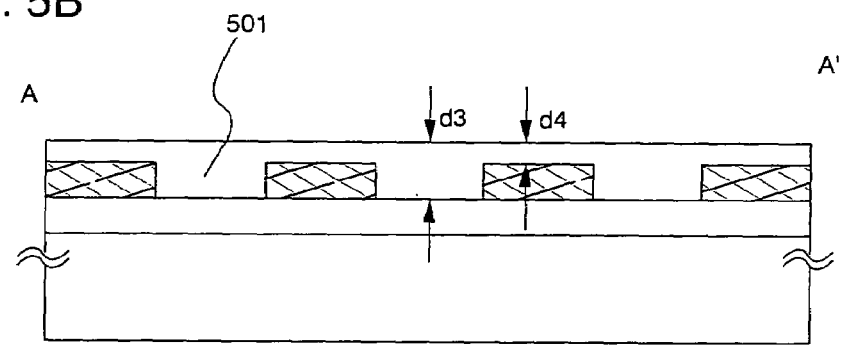

The laser light runs in the direction parallel to the linear concave portions to melt the semiconductor film, and the semiconductor melted flows into the concave portions through surface tension. When solidified, the semiconductor obtains a mostly flat surface as shown in FIGS. 5A and 5B. The resultant crystalline semiconductor film, which is denoted by reference numeral 501, has a thickness d3 on the concave portions and a thickness d4 on the second insulating films, d3 being larger than d4. The characteristic of the thus obtained crystalline semiconductor film 501 is that crystal growth ends and grain boundaries are formed on the second insulating films whereas no grain boundaries other than twin crystal are formed in regions in the concave portions.

Then, preferably, distortion accumulated in the crystalline semiconductor film is removed by heat treatment at 500 to 600° C. The distortion is caused by semiconductor volume shrinkage, thermal stress with the base, and lattice mismatch which are brought about by crystallization. This heat treatment employs usual heat treatment apparatus and, for example, gas heating type rapid thermal annealing (RTA) is used for 1 to 10 minute treatment. This step is not indispensable in the present invention but optional.

Figure 6A:
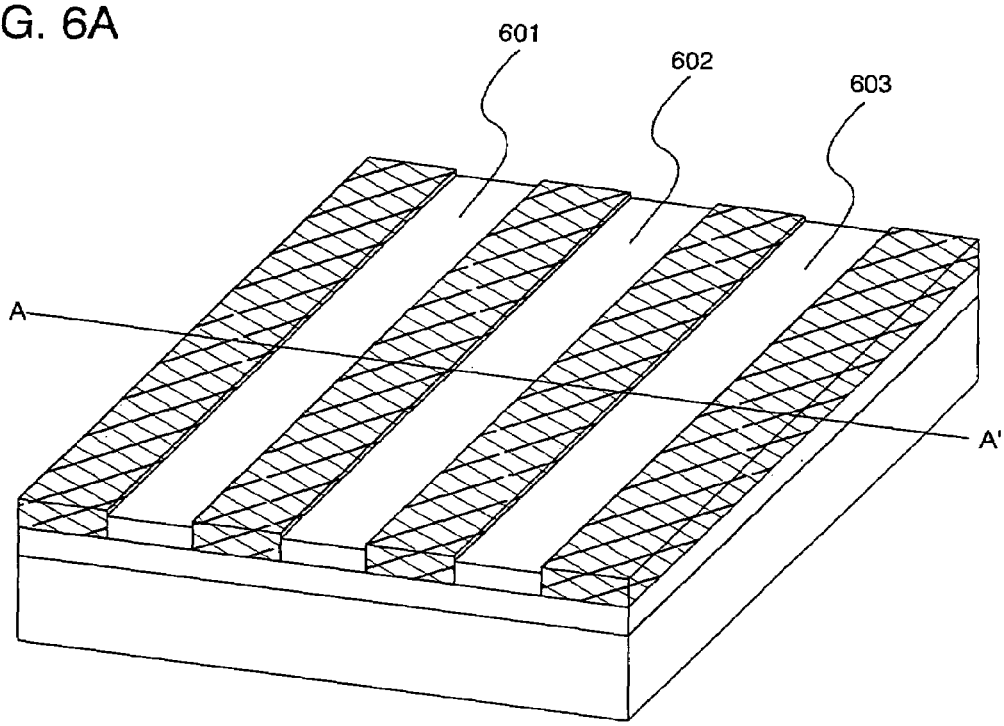
FIGS. 6A and 6B are perspective views illustrating a crystallization method of the present invention.
Figure 6B:
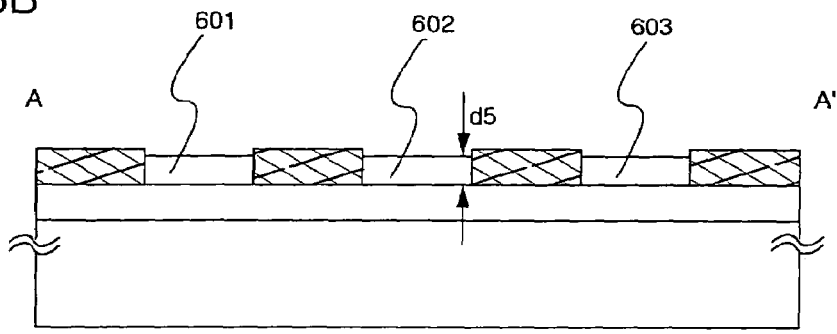

Thereafter, the surface of the crystalline semiconductor film 501 is etched as shown in FIGS. 6A and 6B to selectively dig out crystalline semiconductor films 601, 602, and 603 buried in the concave portions. This is to remove regions of the crystalline semiconductor film which are on the second insulating films and which contain crystal growth ends and grain boundaries by etching, thereby leaving only quality semiconductor regions. At this point, the side faces of the crystalline semiconductor films 601, 602, and 603 have to be completely covered with side walls of the concave portions. In other words, a thickness d5 of the crystalline semiconductor films 601, 602, and 603 is set to the thickness d1 of the second insulating films or less.

The mode most suitable to obtain such crystalline semiconductor films is that the thickness d1 of the second insulating films (the depth of the concave portions) is equal to or larger than the thickness d2 of the semiconductor film 401. If the thickness d1 of the second insulating films (the depth of the concave portions) is smaller than the thickness d2 of the semiconductor film 401, the concave portions are shallow and therefore the surface of the crystalline semiconductor film 501 cannot have sufficient flatness. When the thickness d1 of the second insulating films (the depth of the concave portions) is sufficiently larger than the thickness d2 of the semiconductor film 401, it is possible to make most of the crystalline semiconductor film 501 flow into the concave portions leaving almost none of the film 501 on the second insulating film 203. If the width W2 of the concave portions is larger than 1 µm, it is likely that grain boundaries are formed not only on the second insulating films but also around the center of each concave portion. This is probably because the stress relieving effect is lessened by the increase in interval.

Figure 25:
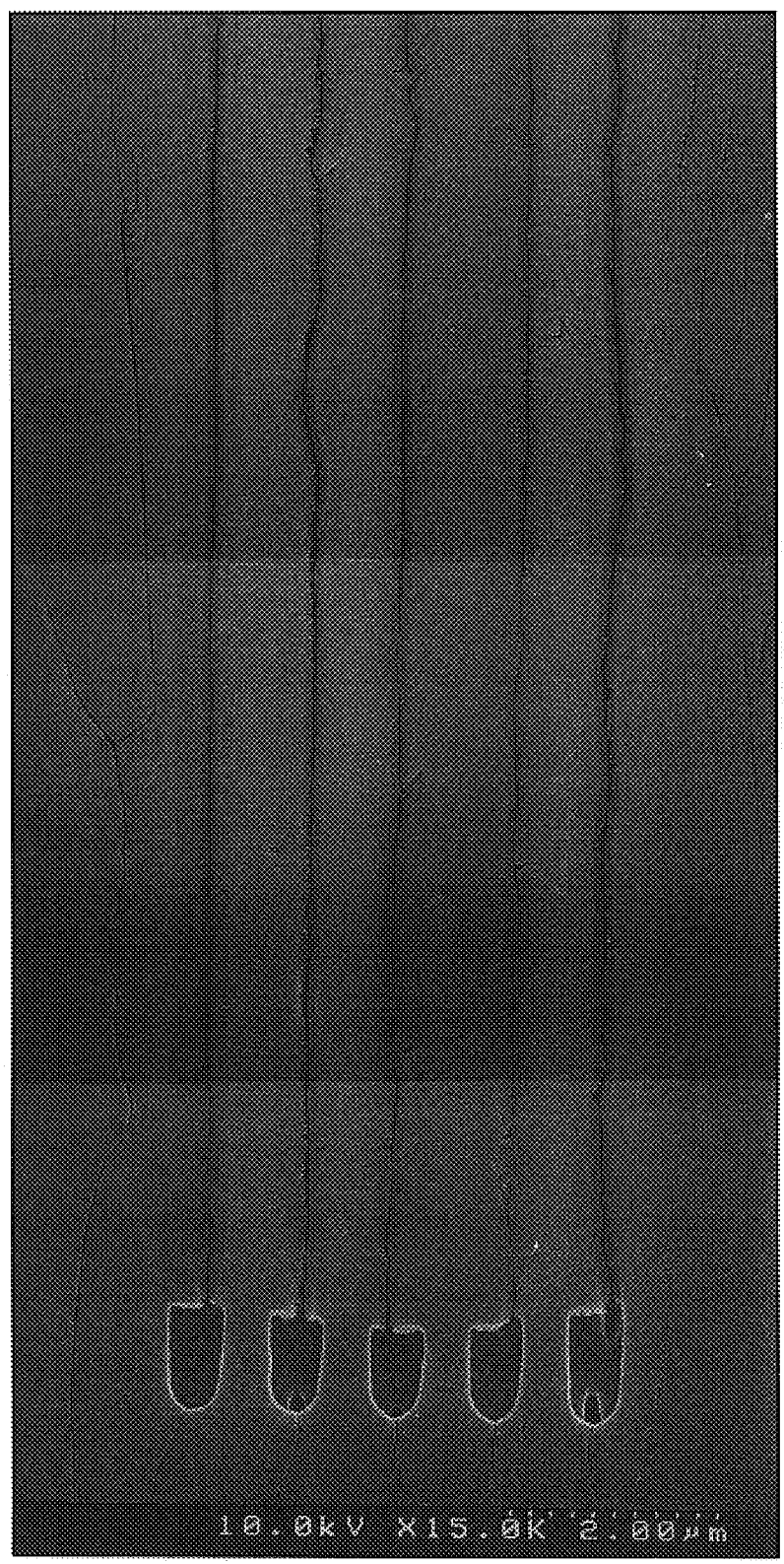
FIG. 25 is a scanning electron microscope (SEM) picture (after secco etching) showing a surface state when an amorphous silicon film with a thickness of 150 nm is formed and crystallized on a base insulating film that has stripe pattern concave portions.

The scanning electron microscope (SEM) picture of FIG. 25 shows an example thereof. In the example, a 170 nm deep level difference is formed and an amorphous silicon film with a thickness of 150 nm is formed and crystallized on a base insulating film where 0.5 µm width concave portions are formed with an interval of 0.5 µm. The surface of the crystalline semiconductor film is etched by a Secco solution in order to show grain boundaries clearly. The Secco solution is a chemical prepared by mixing $K_2Cr_2O_7$ as additive with $HF:H_2O=2:1$.

Figure 28:
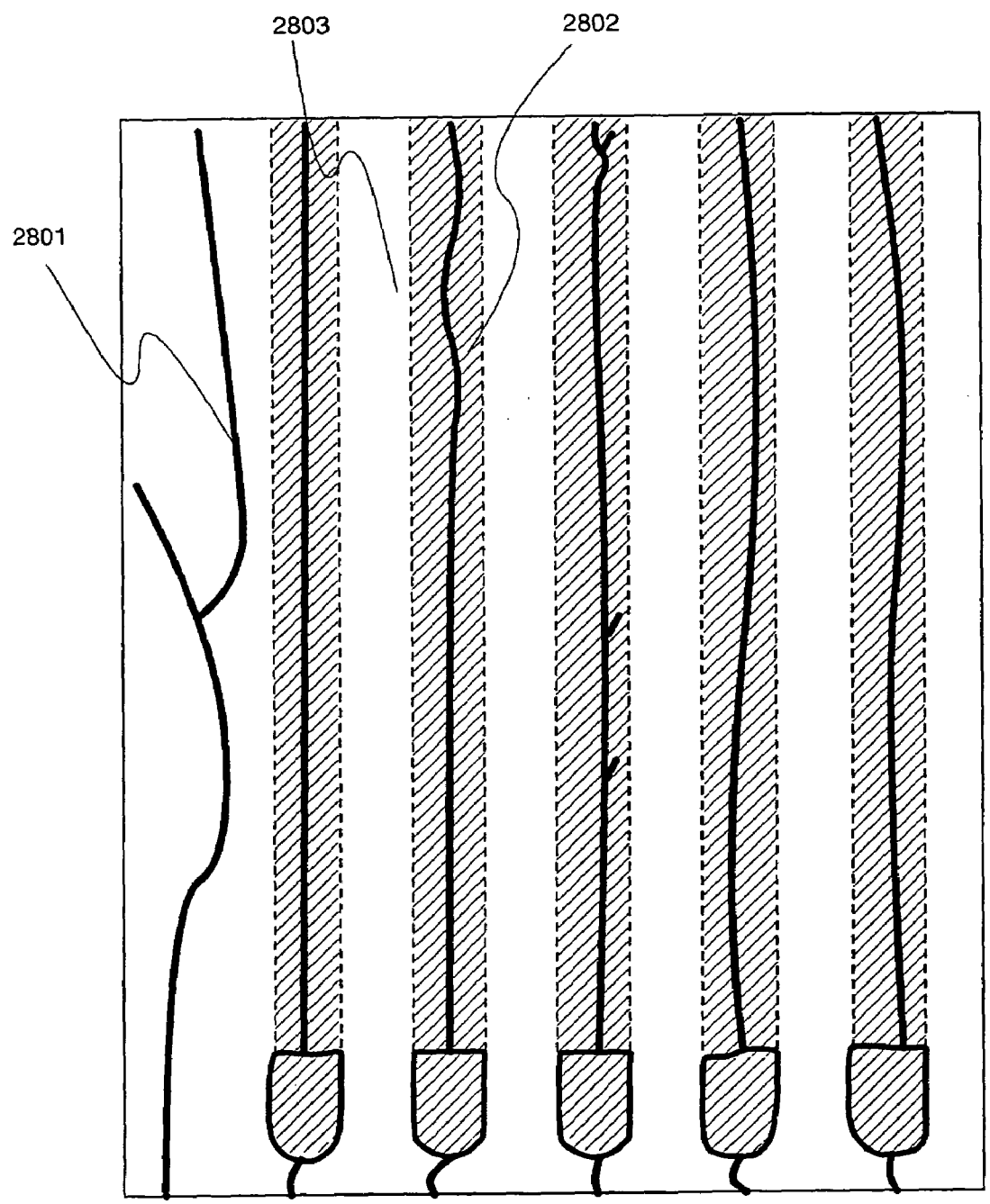
FIG. 28 is a sketch drawing of the scanning electron microscope (SEM) picture shown in FIG. 25.

FIG. 28 is a sketch of the electron microscope (SEM) picture shown in FIG. 25. Hatched portions 2802 are where the second insulating films of FIGS. 3A and 3B are formed and regions 2803 sandwiched between the hatched portions 2802 are semiconductor regions in the concave portions. Bold lines 2801 represent cracks or grain boundaries. It is apparent from FIGS. 28 and 25 that grain boundaries are concentrated on the second insulating films whereas the semiconductor regions in the concave portions have no significant grain boundaries.

In FIGS. 28 and 25, laser light runs from the bottom of the drawings upward. The second insulating films are exposed at the lower ends of the hatched portions 2802. This is supposedly because, in the crystallization step using laser light irradiation, the silicon film melted is moved in the laser light scanning direction and solidified there.

Figure 26:
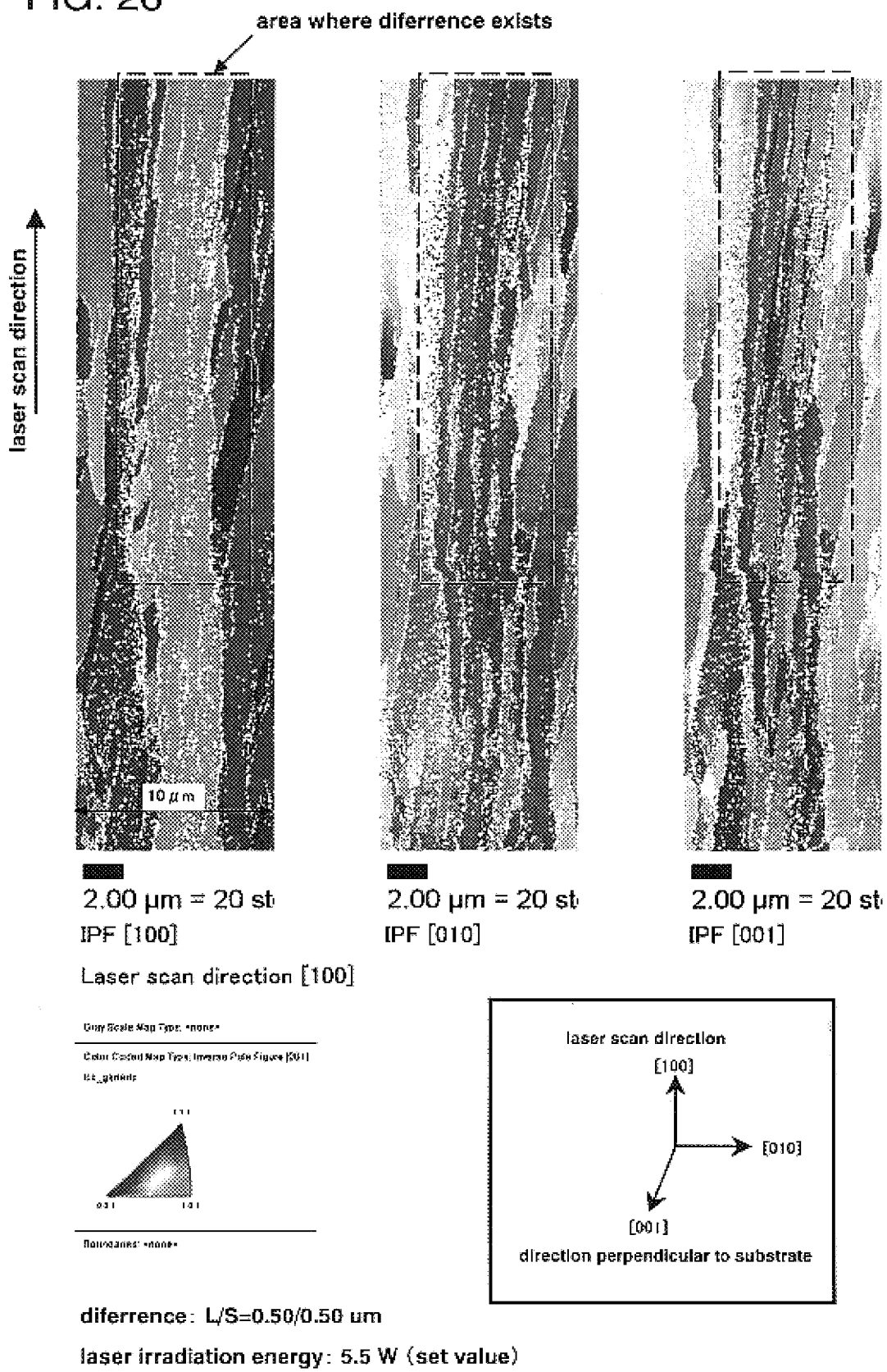
FIG. 26 shows EBSP mapping data indicating the orientation of crystals formed in a concave portion.

FIG. 26 shows results of obtaining the orientation of the crystalline semiconductor films in the concave portions by electron back scatter diffraction pattern (EBSP). EBSP is a method in which a special detector is attached to a scanning electron microscope (SEM), a crystal surface is irradiated with an electron beam, and the crystal orientation is identified from its Kikuchi line by a computer through image recognition to measure the micro crystallinity not in, surface orientation alone but rather all directions of the crystal (hereinafter this method is called an EBSP method for conveniences' sake).

The data of FIG. 26 shows that crystals in the concave portions grow in the direction parallel to the scanning direction of laser light collected into a linear shape. The data confirms that the plane orientation of the growth is mostly uniform throughout one linear concave portion.

Figure 27:
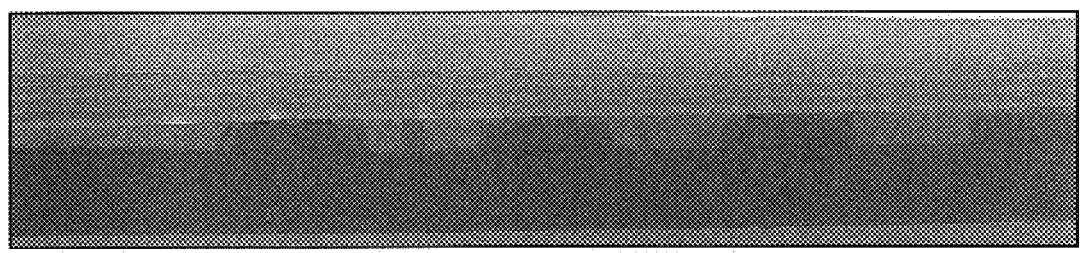
FIG. 27 is a transmission electron microscope (TEM) picture showing crystals formed in a concave portion.

FIG. 27 is a transmission electron microscope (TEM) picture in which a 170 nm deep level difference is formed and an amorphous silicon film with a thickness of 150 nm is formed and crystallized on a base insulating film where 0.5 µm width concave portions are formed with an interval of 0.5 µm.

There is a stripe pattern section in the center of the picture of FIG. 27 in the longitudinal direction. In the stripe pattern section, dark-gray regions are the second insulating films. The crystalline silicon film is formed in a concave portion between the second insulating films and in thin regions on the second insulating films. The portions of the crystalline silicon film that are on the second insulating films have black regions, which indicate that grain boundaries are concentrated on the second insulating films. The portion of the crystalline silicon film that is formed in the concave portion has a linear boundary that is twin crystal, and contains no other grain boundaries than the twin crystal.

By the method described above, a crystalline semiconductor film which contains no other grain boundaries than twin crystal and whose crystal orientation is mostly uniform can be left in a concave portion. An active layer is positioned such that its channel region is in this quality crystalline semiconductor film in the concave portion in accordance with the placement of a semiconductor memory cell. Then a first gate insulating film and a floating gate electrode are formed. A semiconductor memory cell of the present invention is formed through such stages to make it less fluctuated in characteristic and to give it high current drive ability.

At the same time, covering the side faces of the crystalline semiconductor film completely with the side walls of the concave portion provides a structure capable of avoiding electric field concentration on an active layer end upon electric charge injection to the floating gate electrode and discharge therefrom. Accordingly, a highly reliable semiconductor memory cell is obtained.

Furthermore, a TFT which is less fluctuated in characteristic and which has high current drive ability is obtained by positioning, through the above method, an active layer such that its channel region is in the quality crystalline semiconductor film in the concave portion in accordance with the placement of the TFT and then forming a gate insulating film and a gate electrode. This TFT and the above semiconductor memory cell are used to build a memory cell array and peripheral circuits simultaneously, thereby providing a highly reliable semiconductor memory device which can operate at high speed.

Embodiment Mode 3

Referring to the drawings, a description is given on a mode of manufacturing a semiconductor memory cell and a TFT whose channel formation regions are placed in filling regions of a crystalline silicon film on a base insulating film that has concave portions. The filling regions are portions of the crystalline silicon film that fill the concave portions. In each of the drawings for this embodiment mode, (1) is a top view whereas (2) to (5) are sectional views of several portions in the top view.

In the mode shown in this embodiment mode, a memory cell array and peripheral circuits are manufactured simultaneously. On the right hand of the drawings is a part of a NOR memory cell array in which semiconductor memory cells are arranged to form a matrix pattern. Shown on the left hand of the drawings as a representative of the peripheral circuits is an inverter composed of an n-channel TFT and a p-channel TFT.

FIGS. 8A to 8E show a mode in which a first insulating film 802 and a second insulating film 803 are formed on a glass substrate 801 to form stripe pattern concave portions on the insulating surface. The mode shown in FIGS. 8A to 8E can be obtained by the method described in Embodiment Mode 2. The first insulating film 802 in this embodiment-mode is an aluminum oxynitride film with a thickness of 30 to 300 nm. The second insulating film 803 is a silicon oxide film formed to a thickness of 10 to 3000 nm, preferably 100 to 2000 nm by deposition. For the deposition, plasma CVD is employed using a mixture of TEOS and $O_2$ and setting the reaction pressure to 40 Pa, the substrate temperature to 400° C., and high frequency (13.56 MHz) power density to 0.6 W/cm$^2$ for electric discharge. The silicon oxide film is then etched to form the concave portions. The concave portions are 0.01 to 2 µm, preferably 0.1 to 1 µm, in width particularly in areas where the channel formation regions are located.

Then, as shown in FIGS. 9A to 9E, an oxide film or silicon oxynitride film serving as a third insulating film 901 and an amorphous silicon film are formed on the first insulating film 802 and on the second insulating film 803 in succession in the same plasma CVD apparatus without exposing the films to the air. The amorphous silicon film is a semiconductor film mainly containing silicon and is formed by plasma CVD using $SiH_4$ as raw material gas. Reflecting the level difference in the base, the amorphous silicon film does not have a flat surface.

The amorphous silicon film is crystallized by irradiation of continuous wave laser light. FIGS. 9A to 9E show the state after the crystallization. Crystallization conditions include employing a continuous wave mode $YVO_4$ laser oscillation apparatus, using an optical system to collect its 5 to 10 W power second harmonic (wavelength: 532 nm) into linear laser light which is 10 times longer, or more, in the longitudinal direction than in the lateral direction and which has a uniform energy density distribution in the longitudinal direction, and running the laser light at a rate of 10 to 200 cm/sec. The phrase uniform energy density distribution does not exclude everything that is not thoroughly constant. The acceptable range of the energy density distribution is ±10%.

Figure 21A:
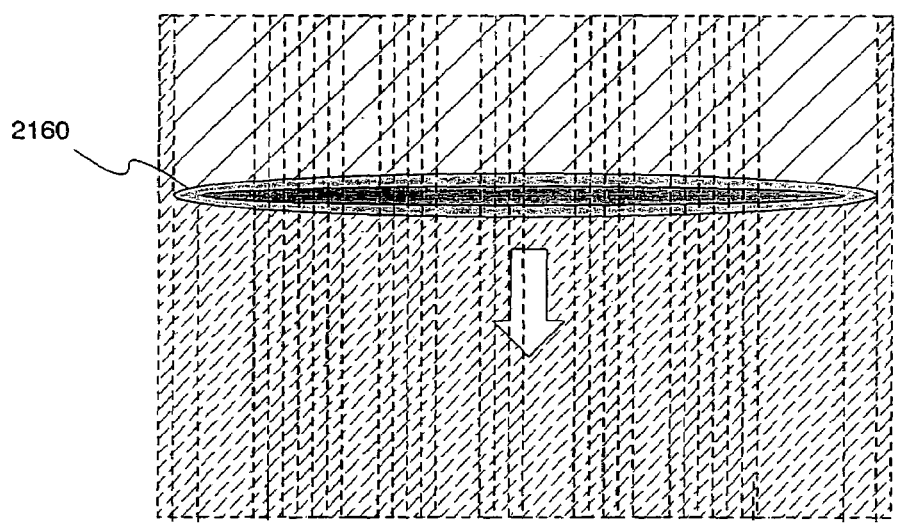
FIGS. 21A and 21B are diagrams illustrating laser light collected into a linear shape and its scanning direction in the present invention.
Figure 21B:
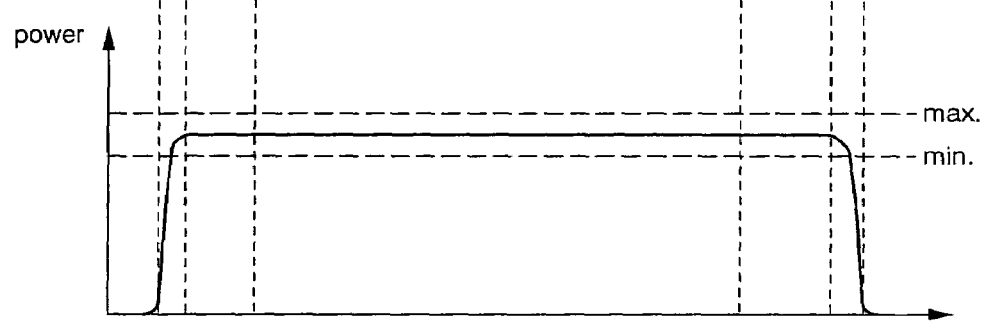

FIGS. 21A and 21B show the relation between the scanning direction of the linearly collected laser light and placement of the concave portions. The intensity distribution of the linearly collected laser light 2160 desirably has a region where the intensity is uniform in the longitudinal direction. This is to keep the temperature of the irradiation region constant by the temperature of the heated semiconductor. If the temperature is varied in the longitudinal direction of the linearly collected laser light (the direction intersecting the scanning direction), the crystal growth direction cannot be kept to the laser light scanning direction. As shown in the drawing, the linear stripe pattern is aligned with the scanning direction of linearly collected laser light 2160. This makes the crystal growth direction match the channel length direction of every transistor. Fluctuation in characteristic between transistor elements can thus be reduced.

The crystallization by laser light collected into a linear shape may be finished in one scan (namely, in one direction), or may be completed by reciprocative scanning for enhanced crystallinity. After the crystallization by the laser light, oxides are removed by hydrofluoric acid, or the surface of the silicon film is treated with an alkaline solution (e.g., ammonium hydrogen peroxide solution treatment) to selectively remove poor quality portions which have higher etching rate. The film is then subjected to the same crystallization treatment. In this way, the crystallinity can be further enhanced.

By irradiation of laser light under these conditions, the amorphous silicon film is melted in an instant and crystallized. In practice, crystallization progresses as the melting zone moves. Melted silicon gathers in the concave portions through surface tension and solidifies. This way, a crystalline silicon film 902 with a flat surface is formed filling the concave portions as shown in FIGS. 9A to 9E.

Thereafter, as shown in FIGS. 10A to 10E, the surface of the crystalline silicon film 902 is etched away while masking with photoresist the regions to serve as source and drain regions as well as the regions to serve as wires that are formed from the crystalline silicon film. The regions that are not masked with the photoresist are etched leaving only portions of the crystalline silicon film that are buried in the concave portions. As a result, the crystalline silicon film, at least in the portions for forming channel regions, is completely covered from the sides with the insulating films that form the concave portions. Obtained through this etching treatment is a crystalline silicon film 1001 in which regions that have been not masked are buried in the concave portions and the masked regions are connected to one another over the concave portions. The crystalline silicon film is etched using as etching gas fluorine-based gas and oxygen, thereby ensuring the selectivity with respect to the base oxide film. For example, mixture gas of $CF_4$ and $O_2$ is used as etching gas.

From the crystalline silicon film 1001 of FIGS. 10A to 10E, island-like silicon films 1101 to 1103 shown in FIGS. 11A to 11E are formed. As in Embodiment Mode 2, the island-like silicon films 1101 to 1103 are characterized by having no other grain boundaries than twin crystal. FIGS. 11A to 11E are not to limit the shapes of the island-like semiconductor films 1101 to 1103, and the shapes of the island-like semiconductor films 1101 to 1103 can be designed freely as long as it follows a given design rule.

In this embodiment, in order to minimize the cell area, a semiconductor memory cell is formed from a crystalline silicon film in one linear concave portion and a source line connected to the semiconductor memory cell is formed from a crystalline silicon film. Therefore this embodiment employs the shape of the island-like silicon film 1103 shown in FIGS. 11A to 11E. On the other hand, a TFT that constitutes a peripheral circuit needs to design the channel width in accordance with the current drive ability necessary. Accordingly, the TFT is given plural channel regions that are arranged in parallel to one another (called a multi-channel TFT) by using as the channel regions crystalline silicon films formed in plural linear concave portions. The shapes of the island-like semiconductor films 1101 and 1102 shown in FIGS. 11A to 11E are therefore employed.

Thereafter, as shown in FIGS. 12A to 12E, the top faces of the island-like semiconductor films 1101 to 1103 are covered by forming a fourth insulating film 1201, conductive films 1202 and 1203, a fifth insulating film 1204, and a conductive film 1205 in order. The fourth insulating film 1201 is used as a gate insulating film of the TFTs and as a first gate insulating film of the semiconductor memory cell. The conductive films 1202 and 1203 are used as gate electrodes of the TFTs and as a floating gate electrode of the semiconductor memory cell. The fifth insulating film 1204 is used as a second gate insulating film of the semiconductor memory cell. The conductive film 1205 is used as a control gate electrode of the semiconductor memory cell. The fourth insulating film 1201 and the fifth insulating film 1204 are silicon oxide films or silicon oxynitride films formed by a known vapor method (plasma CVD, sputtering, or the like) to a thickness of 30 to 200 nm. The fifth insulating film 1204 may be a laminate of $SiO_2$, SiN, and $SiO_2$ (the laminate is called an ONO film). The conductive films 1202, 1203, and 1205 are formed from tungsten or an alloy containing tungsten, or from aluminum or an aluminum alloy, or from polycrystalline silicon.

If the substrate having an insulating surface is a quartz substrate, the fourth insulating film 1201 used as the first gate insulating film of the semiconductor memory cell may be formed by thermal oxidization. For instance, a thermal oxide film with a thickness of 10 to 200 nm is formed by heat treatment in an oxygen atmosphere at 950° C. This provides a quality oxide film and a semiconductor/insulating film interface with little interface levels, and thereby enhances the reliability of the first gate insulating film. Alternatively, the first gate insulating film may have a laminate structure of a deposition film and a thermal oxide film by forming a silicon oxide film or a silicon oxynitride film and then performing thermal oxidization. In this case also, a semiconductor/insulating film interface with little interface levels is obtained, which brings about high reliability.

If a first gate insulating film of a semiconductor memory cell that has a conventional structure is formed by thermal oxidization, the active layer bottom near an active layer end also undergoes thermal oxidization to distort the active layer end. As a result, electric field concentration takes place and lowers the reliability. A semiconductor memory cell of the present invention is free from this problem of prior art, i.e., thermal oxidization on the active layer bottom, because the side faces of its semiconductor active layer are covered with the side walls of a concave portion and therefore thermal oxidization takes place only on the active layer top near an active layer end.

FIGS. 13A to 13E show the stage of forming impurity regions 1301 to 1303 of one conductivity type in the island-like semiconductor films 1101 to 1103. Here, the regions 1302 and 1303 are n-type impurity regions whereas the region 1301 is a p-type impurity region. These impurity regions may be formed in a self-aligning manner using as masks the conductive film 1202, which is used as the gate electrodes of the TFTs, and the conductive film 1205, which is used as the gate electrode of the semiconductor memory cell, or using a photoresist mask. The impurity regions 1301 to 1303 form source regions and drain regions and, if necessary, lightly doped drain regions.

Ion implantation in which impurity ions are accelerated by electric field and implanted in a semiconductor film, or ion doping is employed to form the impurity regions 1301 to 1303.

Then a sixth insulating film 1401 is formed from a silicon nitride film or a silicon oxynitride film as shown in FIGS. 14A to 14E to form wires 1402, which are in contact with the impurity regions forming the source regions and drain regions. Hydrogen contained in the silicon nitride film or the silicon oxynitride film is then released by heat treatment at 400 to 450° C. in order to hydrogenate the island-like semiconductor films.

In this way, the NOR memory cell array composed of a semiconductor memory cell 1405 and the inverter circuit composed of an n-channel multi-channel TFT 1403 and a p-channel multi-channel TFT 1404 as a representative of the peripheral circuits are completed as shown in FIGS. 14A to 14E. The present invention is not limited to this structure, and other known memory cell arrays and circuits that are built from CMOS circuits or from unipolar TFTs can be manufactured in a manner similar to this embodiment mode. The number of channel formation regions arranged in parallel is not limited and can be set to suite the need.

As described, a highly reliable semiconductor memory cell which is less fluctuated in characteristic and which has high current drive ability and a TFT which is less fluctuated in characteristic and which has high current drive ability can be manufactured at the same time by positioning active layers of the semiconductor memory cell and TFT such that their channel regions are formed from a quality crystalline semiconductor film which, at least in the channel regions, is covered from the sides with the side walls of concave portions and which contains no other grain boundaries than twin crystal, and then forming a first gate insulating film, a floating gate electrode, a second gate insulating film, and a control gate electrode in the semiconductor memory cell whereas a gate insulating film and a gate electrode are formed in the TFT.

As a result, a memory cell array in which semiconductor memory cells are arranged to form a matrix pattern and peripheral circuits composed of TFTs are formed on the same substrate to provide a highly reliable semiconductor memory device which can operate at high speed.

Embodiment 1

The present invention can be applied to various semiconductor memory cells that have electric charge accumulating layers between their semiconductor active layers and control gate electrodes. In particular, the present invention is applicable to a semiconductor memory cell having as an electric charge accumulating layer a semiconductor cluster layer, a metal cluster layer, or a nitride film. These semiconductor memory cells are characterized in that regions for accumulating electric charges are placed spatially discretely.

Figure 19A:
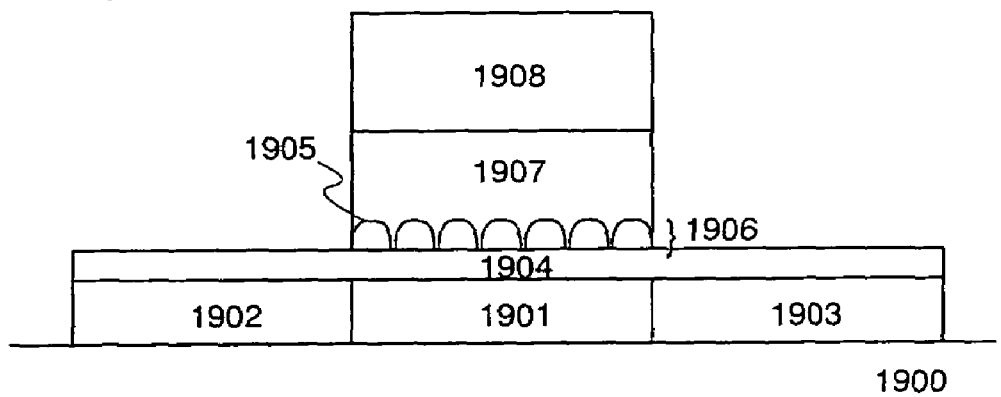
FIGS. 19A to 19C are sectional views of a semiconductor memory cell to which the present invention is applied.

FIG. 19A shows in section in the channel length direction an example of a semiconductor memory cell that uses a semiconductor or metal cluster layer as a region for accumulating electric charges. The semiconductor memory cell shown in FIG. 19A has a semiconductor active layer, a first gate insulating film 1904, a cluster layer 1906, a second gate insulating film 1907, and a control gate electrode 1908 which are layered in order on a substrate 1900. The semiconductor active layer is composed of a channel region 1901 and impurity regions 1902 and 1903 that are doped with an impurity element of one conductivity type. The cluster layer 1906 is a layer constituted of discrete blocks of a semiconductor or metal (called clusters), and the discrete clusters 1905 serve as the electric charge trapping center.

Figure 19B:
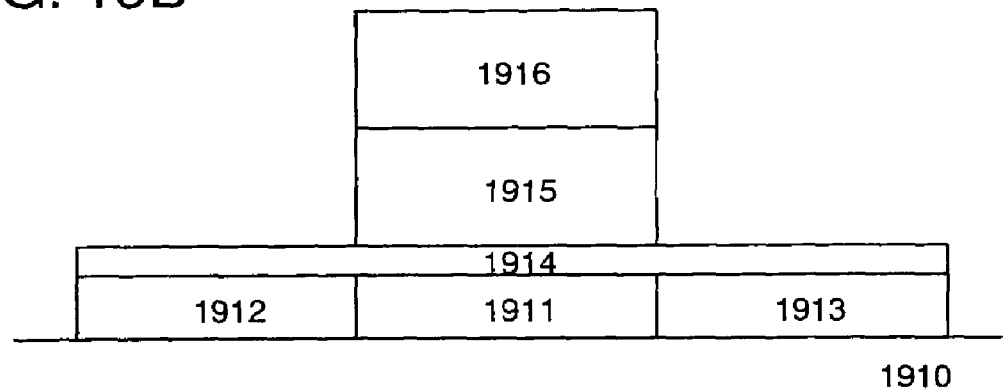
Figure 19C:
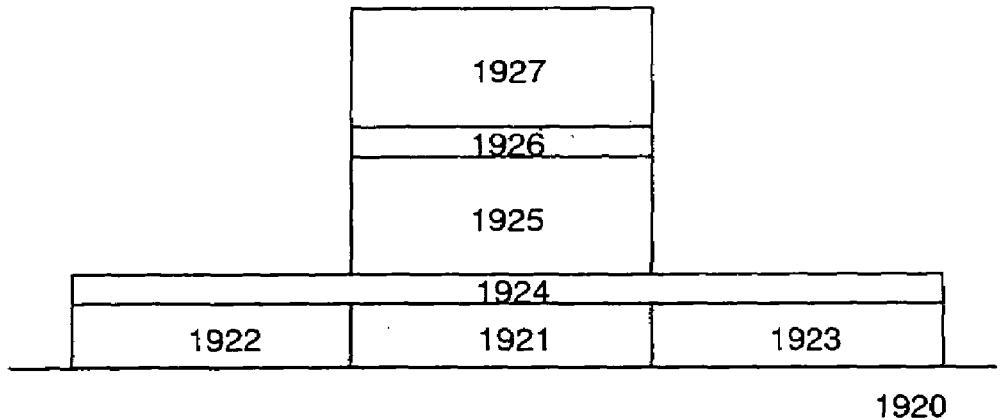

Examples of a known semiconductor memory cell that uses a nitride film or the like as a region for accumulating electric charges include a MNOS (metal nitride oxide semiconductor) element and a MONOS (metal oxide nitride oxide semiconductor) element. FIG. 19B shows in section in the channel length direction an example of a MNOS memory cell and FIG. 19C shows in section in the channel length direction an example of a MONOS memory cell. The semiconductor memory cell shown in FIG. 19B has a semiconductor active layer, a first gate insulating film 1914, a nitride film 1915, and a control gate electrode 1916 which are layered in order on a substrate 1910. The semiconductor active layer is composed of a channel region 1911 and impurity regions 1912 and 1913 that are doped with an impurity element of one conductivity type. The semiconductor memory cell shown in FIG. 19C has a semiconductor active layer, a first gate insulating film 1924, a nitride film 1925, a second gate insulating film 1926, and a control gate electrode 1927 which are layered in order on a substrate 1920. The semiconductor active layer is composed of a channel region 1921 and impurity regions 1922 and 1923 that are doped with an impurity element of one conductivity type. In both of the semiconductor memory cells, spatially discrete impurity levels in the nitride films serve as the electric charge trapping center.

When applying the present invention to any of the semiconductor memory cells described above, the channel region is formed from a crystalline semiconductor film which is formed in a linear concave portion on an insulating surface with its side faces completely covered with the side walls of the concave portion, which contains no other grain boundaries than twin crystal, and whose crystals have mostly uniform orientation.

An effect obtained when a semiconductor memory cell uses an electric charge accumulating layer in which regions for accumulating electric charges are discretely placed is that the electric charge holding characteristic is not easily affected by defects and pin holes of the first gate insulating film. In the case of a semiconductor memory cell having a floating gate electrode, where regions for accumulating electric charges are placed continuously, merely one pin hole in the first gate insulating film is enough to leak all of electric charges accumulated in the floating gate electrode. Therefore, pin holes in the first gate insulating film greatly affect the electric charge holding characteristic of the semiconductor memory cell. On the other hand, in a semiconductor memory cell where regions for accumulating electric charges are discretely placed, the number of regions that are affected by a pin hole is limited while many other electric charge accumulating regions are free from the influence. Accordingly, pin holes in the first gate insulating film have little influence on the electric charge holding characteristic of this semiconductor memory cell.

Embodiment 2

In addition to the method of forming crystalline semiconductor films of the present invention disclosed in Embodiment Mode 2, in which laser light is irradiated to an amorphous semiconductor film, thus causing crystallization, additional laser light may also be irradiated after crystallization due to solid state growth, thus causing melting and recrystallization.

Ni may be added as a metal element that has a catalytic action for promoting crystallization after forming the amorphous semiconductor film 401 in FIG. 4 in order, for example, to reduce the crystallization temperature of the amorphous semiconductor film (amorphous silicon film, for instance) and improve its orientation. There are no limitations placed on the method used for Ni addition, and spin coating, evaporation, sputtering, and the like may be applied. An aqueous solution of 5 ppm nickel acetate is applied when using spin coating, thus forming a metal element containing layer. The catalyst element is of course not limited to Ni, and other known materials may also be used.

The amorphous semiconductor film 401 is then crystallized by heat treatment at 580° C. for four hours. Laser light or strong light equivalent to the laser light is then irradiated to the crystallized semiconductor film, thus melting the crystalline semiconductor film and causing recrystallization. The crystalline semiconductor film 501 having a nearly level surface similar to that of FIG. 5 can thus be obtained. A region is also formed in the crystalline semiconductor film 501 in which growth ends and the crystal grain boundaries are formed over a second insulating film 304.

The advantage of using a crystallized semiconductor film as an object to be irradiated by laser light is in the degree of variability in the optical absorption coefficient of the semiconductor film. The optical absorption coefficient has almost no change when a crystallized semiconductor film is irradiated by laser light and melted. The margin placed on the laser light irradiation conditions can therefore be increased.

The metal element remains in the crystalline semiconductor film thus formed, and can be removed by using a gettering process. US 2002/0134981 may be referred to regarding details of this technique. Further, heat treatment performed in this gettering process also has an effect for relieving crystalline semiconductor film distortions.

The crystalline semiconductor film in depression portions is then extracted similarly to Embodiment Mode 2. The extracted crystalline semiconductor film does not contain crystal boundaries except of bi-crystals and has almost uniform crystal orientations. Further, a side surface of a portion which at least becomes a channel region of a semiconductor memory cell is covered by a sidewall of the depression portions. Semiconductor memory cells and TFTs can be completed by using the crystalline semiconductor films.

Incidentally, this embodiment can be applied to the semiconductor memory cells described in Embodiment 1.

Embodiment 3

The present embodiment shows an example of a structure of a laser processing apparatus capable of being applied when performing crystallization.

FIGS. 20A and 20B are diagrams showing a front view and a side view of the structure of a laser processing apparatus made from laser oscillator apparatuses 2001a and 2001b, a shutter 2002, high conversion mirrors 2003 to 2006, cylindrical lenses 2008 and 2009, a slit 2007, a holding platform 2011, driving means 2012 and 2013 for positioning the holding platform 2011 in the x-direction and the y-direction, a controlling means 2014 for controlling the driving means, an information processing means 2015 for sending signals to the laser oscillator apparatuses 2001a and 2001b, and the controlling means 2014 based on a program stored in advance, and the like.

The laser oscillator apparatus applies a rectangular beam solid state laser oscillator apparatus, and in particular, preferably applies a slab laser oscillator apparatus. Alternatively, a solid state laser oscillator apparatus that uses a crystal such as YAG, YVO$_4$, YLF, YAlO$_3$, or the like doped with Nd, Tm, and Ho combined with a slab structure amplifier may also be used. Crystals such as Nd:YAG, Nd:GGG (gadolinium, gallium, garnet), Nd:GsGG (gadolinium, scandium, gallium, garnet) and the like can be used as the slab material. In addition, a gas state laser oscillator apparatus, or a solid state laser oscillator apparatus, capable of emitting a continuous wave can also be applied. Laser oscillator apparatuses using crystals such as YAG, YVO$_4$, YLF, YAlO$_3$, or the like doped with Cr, Nd, Er, Ho, Ce, Co, Ti, or Tm are applied as continuous wave solid state laser oscillator apparatuses. Although differing by the dopant material used, the fundamental wave is emitted at a wavelength from 1 μm to 2 μm. A diode excited solid state laser oscillator apparatus may also be connected in cascade in order to obtain high output equal to or greater than 5 W.

Circular shape or rectangular shape laser light output from these types of laser oscillator apparatuses is concentrated into a linear shape in the cross sectional shape of an irradiation surface by the cylindrical lenses 2008 and 2009. Further, this becomes a structure in which a high conversion mirror is suitably regulated, and the laser light is made incident at an incline of 10 to 80° in order to prevent interference by the irradiation surface. If the cylindrical lenses 2008 and 2009 are made from synthesized quartz, a high transmissivity is obtained. Therefore, a coating operation subjected on the surface of lenses is applied in order to achieve a transmissivity equal to or grater than 99% with respect to the wavelength of the laser light. The cross sectional shape of the irradiation surface is of course not limited to a linear shape, and arbitrary shapes such as a rectangular shape, an elliptical shape, and an oval shape may also be used. Whichever shape is employed, those having a ratio between their minor axis and their major axis contained within a range of 1 to 10, to 1 to 100, are indicated. Further, the wavelength converter element 2010 is prepared in order to obtain a harmonic with respect to the fundamental wave.

Further, laser processing of a substrate 2020 is possible by moving the holding platform 2011 in two axial directions by using the driving means 2012 and 2013. For movement in one direction, it is possible to continuously move the holding platform 2011 at a constant velocity from 1 to 200 cm/sec, preferably from 5 to 50 cm/sec, over a distance longer than the length of one side of the substrate 2020. It becomes possible to perform non-continuous stepwise movement in the other direction over a distance on the same order as that of the longitudinal direction of the linear shape beam. Emission of the laser oscillator apparatuses 2001a and 2001b is operated in synchronous with operation of the holding platform 2011 by the information processing means 2015 in which a microprocessor is mounted.

It is possible to process the entire surface of the substrate by laser light irradiated from a fixed optical system by linear motion of the holding platform 2011 in the x-direction shown in the figure. A position detecting means 2016 detects that the substrate 2020 is in a position for irradiating laser light, and transfers this signal to the information processing means 2015. Emission operations of the laser oscillators 2001a and 2001b and their timing are synchronized by the information processing means 2015. That is, the laser emission is stopped when the substrate 2020 is not in a position for the irradiation of laser light, thus extending its lifetime.

Laser light emitted to the substrate 2020 by a laser irradiation apparatus having this type of structure can process desired regions, or the entire surface, of the semiconductor film by relative motion in the x-direction and the y-direction shown in the figure.

Incidentally, this embodiment can be freely combined with Embodiments 1 and 2.

Embodiment 4

Embodiment Modes 2 and 3 describe a case of forming a crystalline semiconductor film on a base insulating film that has stripe pattern concave portions. The stripe pattern does not have to be perfect in the present invention, and the feature of the present invention is that at least portions of a crystalline semiconductor film that are used to form channel regions of a semiconductor memory cell and TFT are formed in linear concave portions. For instance, a source region, a drain region, and a semiconductor film wire region may be formed from portions of the crystalline semiconductor film that are formed in inter-stripe concave portions that connect the linear concave portions to one another. The portions of the crystalline semiconductor film that are in the inter-strip concave portions might contain grain boundaries and crystal defects, but it is not a serious problem when they are used as a source region, a drain region, and a semiconductor film wire.

This embodiment describes a process of manufacturing a semiconductor memory cell and a TFT employing a base insulating film in which inter-stripe concave portions for connecting stripe pattern concave portions to one another are placed in accordance with positions of source regions, drain regions, and semiconductor film wire regions. The description is given with reference to FIGS. 15A to 15E and FIGS. 16A to 16E, and only deals with details of the process that are different from those in Embodiment Mode 3.

FIGS. 15A to 15E show formation of a first insulating film 1501 and a second insulating film 1502 for forming stripe pattern concave portions and inter-stripe concave portions. A region 1503 encircled by the dotted line in the drawing serves as a source wire in the memory cell array, and a concave portion is placed in accordance with this source wire region. Regions 1504 to 1507 surrounded by the dotted lines serve as source and drain regions of the TFT.

Next, an amorphous semiconductor film is formed by deposition on the insulating film and is irradiated with linearly collected laser light to form a crystalline semiconductor film. Then portions of the crystalline semiconductor film that are on the second insulating film 1502 are removed by etching to dig out portions of the crystalline semiconductor film that fill the concave portions. FIGS. 16A to 16E show island-like semiconductor films 1601, 1602, and 1603 formed by etching the crystalline semiconductor film in accordance with the placement of the semiconductor films for forming the semiconductor memory cell and the TFT and with the placement of the semiconductor film wire.

Then, a first gate insulating film, a floating gate electrode, a second gate insulating film, and a control gate electrode are formed in accordance with the placement of the semiconductor memory cell while a gate insulating film and a gate electrode are formed in accordance with the placement of the TFT. Thereafter, n-type or p-type impurity regions, an interlayer insulating film, and various wires are formed in this order to obtain the memory cell array and the peripheral circuits at the same time as in Embodiment Mode 3.

The concave portions formed in advance in the base insulating film in accordance with positions of source and drain regions and of a semiconductor film wire region eliminate the need for the mask in Embodiment Mode 3 which covers the source and drain regions and the semiconductor film wire region. Therefore, one less mask is necessary to manufacture the semiconductor memory device.

This embodiment can be combined freely with any structure of Embodiments 1 through 3.

Embodiment 5

This embodiment describes another method of manufacturing a memory cell array and peripheral circuits at the same time. A semiconductor memory cell of the present invention is characterized in that side faces of a crystalline semiconductor film for forming a channel region are covered with side walls of a concave portion. However, TFTs which are on the same substrate as the semiconductor memory cell to constitute peripheral circuits such as a decoder circuit for selecting a memory cell and a writing/reading circuit, or other semiconductor integrated circuits, do not need to have this structure.

If concave portion side walls covering the crystalline semiconductor films that form channel regions of TFTs constituting peripheral circuits and other semiconductor integrated circuits are removed, not only the top faces of the crystalline semiconductor films but also their side faces can serve as channel regions. This way, TFTs having high current-drive ability are obtained.

The description is given with reference to FIGS. 17A to 17E and FIGS. 18A to 18E, and only deals with details of the process that are different from those in Embodiment Mode 3.

FIGS. 17A to 17E show removal by etching of the second insulating film while masking with photoresist a region where a semiconductor memory cell is to be placed (the right half of FIG. 15A) after the state of FIGS. 11A to 11E is reached by following the description in Embodiment Mode 3. This etching treatment employs chemical treatment by buffer hydrofluoric acid, or dry etching using $CHF_3$.

Through this step, the side faces and top faces of island-like semiconductor films 1701 and 1702 to serve as channel regions of TFTs are exposed as shown in FIGS. 17A to 17E. By forming gates in the exposed portions, the side faces and top faces of the island-like semiconductor films 1701 and 1702 can serve as channel formation regions.

In this embodiment, the etching is performed reaching the first insulating film. However, the etching may be stopped halfway through the second insulating film. Adjusting the depth of the etching allows adjustment of the depth of the channel formation regions of the island-like semiconductor films 1701 and 1702. In other words, selection of a crystallization region is made possible.

Then, as shown in FIGS. 18A to 18E, a first gate insulating film, a floating gate electrode 1801, a second gate insulating film, and a control gate electrode 1802 are formed in accordance with the placement of the semiconductor memory cell and brought into contact with the top face of the crystalline semiconductor film while gate insulating films and gate electrodes are formed in accordance with the placement of the TFTs and brought into contact with the side faces and top faces of the crystalline semiconductor films.

Thereafter, n-type or p-type impurity regions, an interlayer insulating film, and various wires are formed in this order to obtain the memory cell array and the peripheral circuits at the same time as in Embodiment Mode 3.

With this structure, the side faces of the crystalline semiconductor film for forming the channel region of the semiconductor memory cell are covered with the side walls of the concave portion to avoid electric field concentration at an active layer end upon injection of electric charges to the floating gate electrode and discharge therefrom, obtaining high reliability. The structure also makes it possible to form channels on the side faces and top faces of the crystalline semiconductor films in the TFTs that constitute the peripheral circuits and, as a result, the channel width is effectively increased to improve the drive current ability.

This embodiment can be combined freely with any structure of Embodiments 1 through 4.

Embodiment 6

Application of a non-volatile memory to a microprocessor integrated on one chip, such as an RISC processor or an ASIC processor, will be described as an example of a semiconductor memory device of the present invention.

Figure 22:
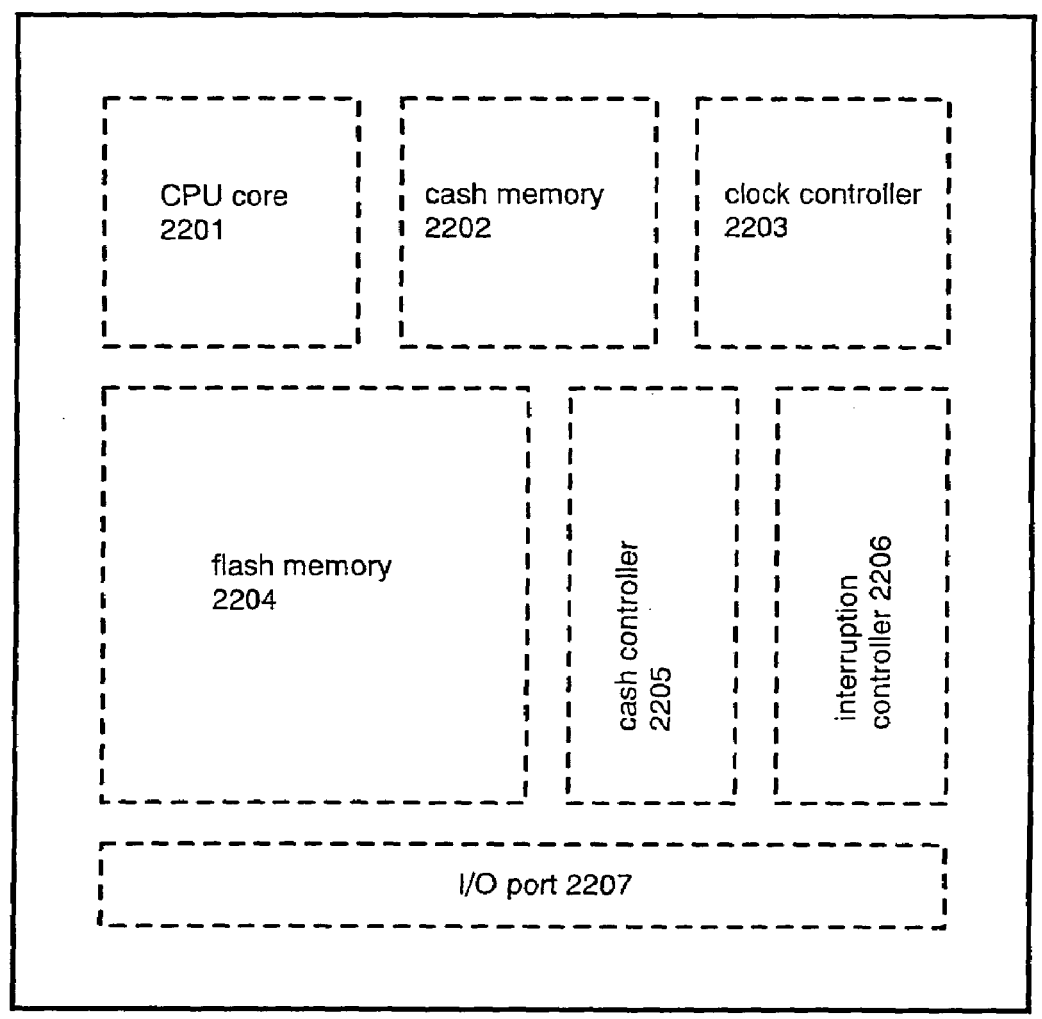
FIG. 22 is a diagram showing an example of a microprocessor.

Shown in FIG. 22 is an example of a microprocessor. This is a typical microprocessor and is composed of a CPU core 2201, a flash memory 2204, a clock controller 2203, a cash memory 2202, a cash controller 2205, an interruption controller 2206, an I/O port 2207, etc. The microprocessor shown in FIG. 22 is a simplified example and the circuit design of an actual microprocessor is varied depending on its use.

The microprocessor shown in FIG. 22 is manufactured by one of the manufacturing methods described in Embodiment Modes and Embodiments, and is composed of semiconductor memory cells and TFTs in which a crystalline silicon film is formed on a base insulating film having concave portions and their channel formation regions are placed in filling regions of the crystalline silicon film that fill the concave portions. The flash memory 2204 uses a semiconductor memory cell of the present invention. The cash memory is, for example, an SRAM.

By thus applying the present invention to a microprocessor, a semiconductor memory device which has a highly reliable non-volatile memory and which can operate at high speed can be obtained. Although depending on the design rule and other factors, the operation speed obtained is such that the flash memory reading cycle is 500 nsec or less and the CPU operation frequency is 5 MHz or more.

This embodiment can be combined freely with any structure of Embodiment Modes and Embodiments 1 through 5.

Embodiment 7

Figure 23:
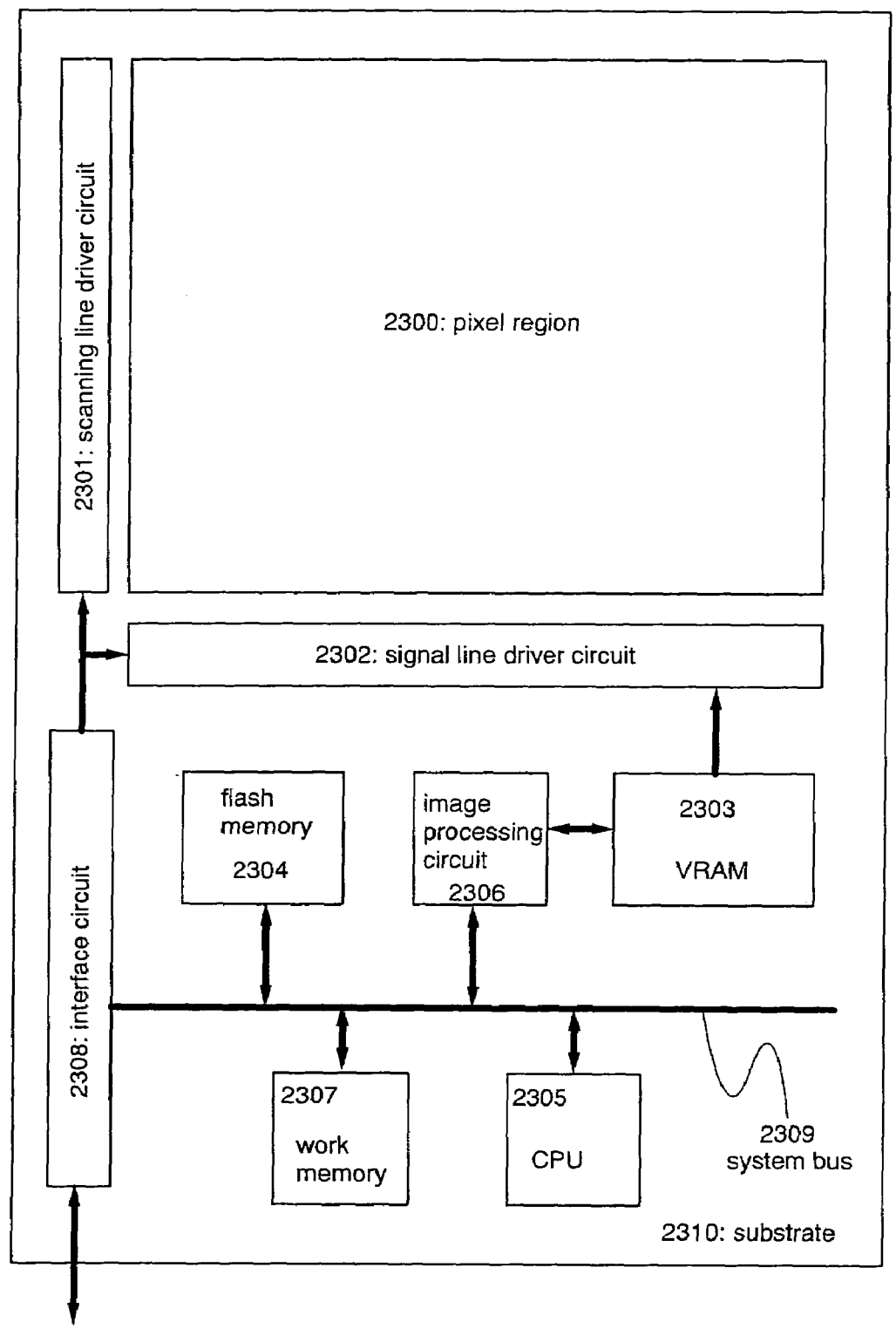
FIG. 23 is a diagram showing an example of a semiconductor memory device.

This embodiment gives a description with reference to FIG. 23 on an example of a semiconductor memory device that employs the mode of system on panel in which an image display portion (typically a liquid crystal display portion or an EL display portion), a non-volatile memory, and other semiconductor integrated circuits are formed integrally on a substrate having an insulating surface.

In FIG. 23, the semiconductor memory device has a pixel region 2300, a scanning line driving circuit 2301, a signal line driving circuit 2302, a VRAM 2303, a flash memory 2304, a CPU 2305, an image processing circuit 2306, a work memory 2307, and an interface circuit 2308 which are integrally formed on a substrate 2310 having an insulating surface.

The semiconductor memory device shown in FIG. 23 is a device which receives input of image data or creates image data, processes the image data, and converts the format to display an image. Examples of the semiconductor memory device include a video camera, a car navigation system, a personal computer, and a game machine.

These semiconductor memory devices receive data that is the base of image data via their input terminals in accordance with their respective modes. For instance, a broadcast receiving machine receives input data through an antenna and a video camera receives input data from a CCD. Instead, input data from DV tape of a memory card may be adopted. Alternatively, an input signal from a keyboard or other control signals may be inputted through the input terminals. Inputted data that is the base of an image is sent through the interface circuit 2308 and a system bus 2309 and is stored in the flash memory 2304, or temporarily stored in the work memory 2307, or converted by the image processing circuit 2306 into an image signal, which is stored in the VRAM. The image processing circuit 2306 performs image signal processing such as decoding of image data which has been compressed and encoded according to the MPEG standard, tape format, or the like, and interpolation and resizing of an image. A control signal inputted is used for communication with the CPU and the image processing circuit, and is inputted to the signal line driving circuit and the scanning line driving circuit.

The CPU 2305 controls the flash memory 2304, the work memory 2307, the interface circuit 2308, and other circuits. Creating and processing data that is the base of image data are also included in the task of the CPU 2305. The flash memory 2304 is used as a memory region for storing color data and character data necessary to create and process data that is the base of image data, or as a memory region for storing program data. The work memory 2307 is a DRAM or SRAM used as a memory region for storing image data and data that is the base of the image data, or as a work memory region for control by the CPU, or as a memory for other purposes.

The image display portion composed of the signal line driving circuit 2302, the scanning line driving circuit 2301, and the pixel region 2300 is a region for displaying an image. The signal line driving circuit 2302 and the scanning line driving circuit 2301 receive a control signal through the interface circuit from the exterior. In response to the control signal, the signal line driving circuit 2302 takes in image data that has been outputted from the image processing circuit 2306 and stored in the VRAM, so that an image is displayed by the pixel region.

A semiconductor memory device having a non-volatile memory for displaying an image from image data created or received from the outside is structured as described above. The semiconductor memory device shown in FIG. 23 is manufactured by one of the manufacturing methods described in Embodiment Modes and Embodiments, and is composed of semiconductor memory cells and TFTs in which a crystalline silicon film is formed on a base insulating film having concave portions and their channel formation regions are placed in filling regions of the crystalline silicon film that fill the concave portions. The flash memory 2304 uses a semiconductor memory cell of the present invention.

By thus applying the present invention to a semiconductor memory device, a semiconductor memory device which has a highly reliable non-volatile memory and which can operate at high speed can be obtained. The integral formation of the circuits has effects of reducing the device in size and lowering power consumption.

The image display portion composed of the signal line driving circuit 2302, the scanning line driving circuit 2301, and the pixel region 2300 may be manufactured on a substrate different from the one on which an image processing unit composed of other circuits is formed. In this case, the substrate on which the image processing unit is formed can build a broadcast receiving machine or a game machine that does not have a display portion. It is of course possible for the above semiconductor memory device to have a plurality of substrates mounted thereto.

This embodiment can be combined with Embodiments 1 through 5.

Embodiment 8

The present invention can be used in various devices. Examples thereof include portable information terminals (electronic schedulers, mobile computers, mobile telephones, and the like), video cameras, digital cameras, personal computers, television monitors, projection display devices, and the like. FIGS. 24A to 24G show examples of these devices.

Figure 24A:
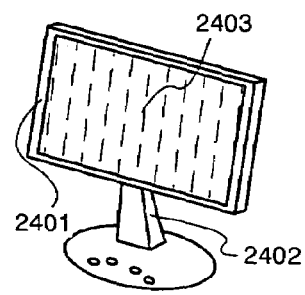
FIGS. 24A to 24G are diagrams showing examples of a semiconductor memory device.

FIG. 24A shows an example of application of the present invention to a television monitor, which is composed of a case 2401, a supporting base 2402, a display unit 2403, etc. A television monitor having a high reliable nonvolatile memory with first operation speed can be obtained by employing a semiconductor memory cell formed on a glass substrate of the present invention.

Figure 24B:
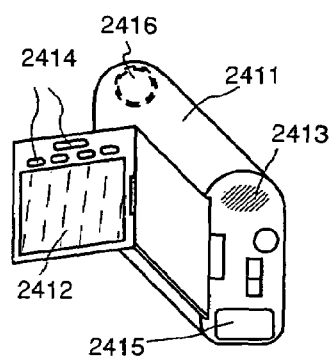

FIG. 24B shows an example of application of the present invention to a video camera, which is composed of a main body 2411, a display unit 2412, an audio input unit 2413, operation switches 2414, a battery 2415, an image receiving unit 2416, etc. A video camera having a high reliable nonvolatile memory with first operation speed can be obtained by employing a semiconductor memory cell formed on a glass substrate of the present invention.

Figure 24C:
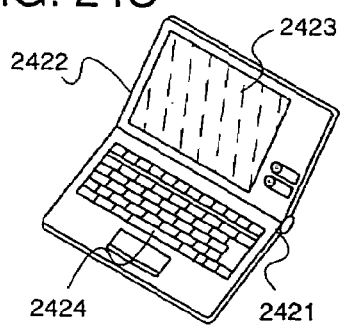

FIG. 24C shows an example of application of the present invention to a laptop computer, which is composed of a main body 2421, a case 2422, a display unit 2423, a keyboard 2424, etc. A laptop computer having a high reliable non-volatile memory with first operation speed can be obtained by employing a semiconductor memory cell formed on a glass substrate of the present invention.

Figure 24D:
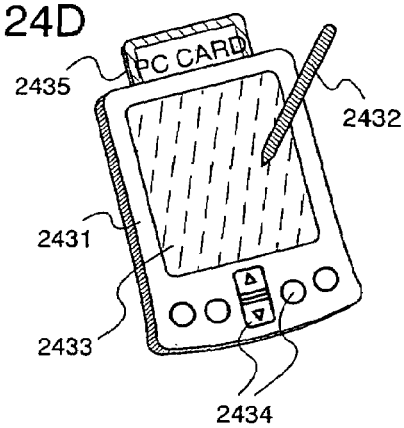

FIG. 24D shows an example of application of the present invention to a PDA (Personal Digital Assistant), which is composed of a main body 2431, a stylus 2432, a display unit 2433, operation buttons 2434, an external interface 2435, etc. A PDA having a high reliable nonvolatile memory with high operation speed can be obtained by employing a semiconductor memory cell formed on a glass substrate of the present invention.

Figure 24E:
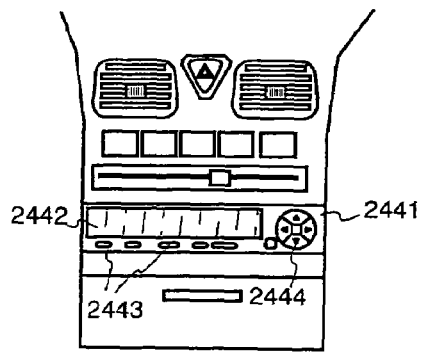

FIG. 24E shows an example of application of the present invention to an audio playback device, specifically, an on-vehicle audio device, which is composed of a main body 2441, a display unit 2442, operation switches 2443 and 2444, etc. An audio playback device having a high reliable nonvolatile memory with high operation speed can be obtained by employing a semiconductor memory cell formed on a glass substrate of the present invention.

Figure 24G:
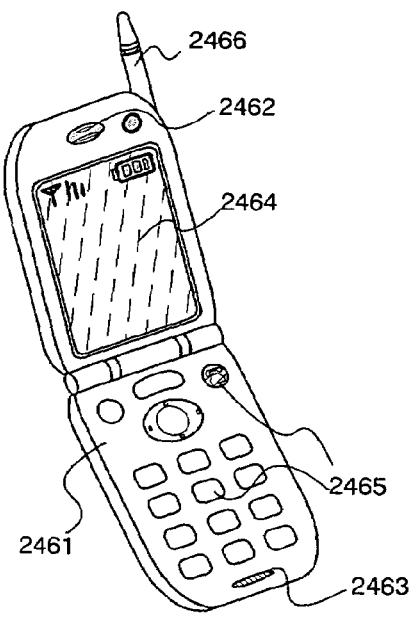
Figure 24F:
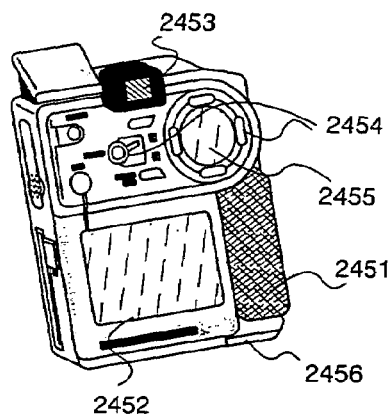

FIG. 24F shows an example of application of the present invention to a digital camera, which is composed of a main body 2451, a display unit (A) 2452, an eye piece portion 2453, operation switches 2454, a display unit (B) 2455, a battery 2456, etc. A digital camera having a high reliable nonvolatile memory with high operation speed can be obtained by employing a semiconductor memory cell formed on a glass substrate of the present invention.

FIG. 24G shows an example of application of the present invention to a mobile phone, which is composed of a main body 2461, an audio output unit 2462, an audio input unit 2463, a display unit 2464, operation switches 2465, an antenna 2466, etc. A mobile phone having a high reliable nonvolatile memory with high operation speed can be obtained by employing a semiconductor memory cell formed on a glass substrate of the present invention.

Note that, the devices shown here are merely examples and the present invention is not limited to these applications.

This embodiment can be implemented by combining with Embodiments 1 to 5.

The present invention makes it possible to form a crystalline semiconductor film whose sides are covered with side walls of a concave portion in an area where a channel region of a semiconductor memory cell is to be formed.

As a result, local degradation of a first gate insulating film which accompanies electric field concentration on a semiconductor active layer end is prevented and a highly reliable semiconductor memory cell can be obtained.

At the same time, the present invention can make distortion or stress accompanying crystallization concentrate on other regions than the concave portion and therefore a quality crystalline semiconductor film containing no other grain boundaries than twin crystal can be formed in the concave portion.

By controlling the crystallinity of the channel region and enhancing the crystallinity of the channel region in this way, a semiconductor memory cell and TFT which have high field effect mobility and which are less fluctuated in characteristic are manufactured.

The above semiconductor memory cell and TFT are used to form a memory cell array and peripheral circuits simultaneously, thereby providing a highly reliable semiconductor memory device which can operate at high speed.

What is claimed is:
1. A method of manufacturing a semiconductor memory cell comprising:
    forming a plurality of insulating films so that at least one linear concave portion is formed over a substrate having an insulating surface;
    forming an amorphous semiconductor film in a region that includes the at least one linear concave portion;
    melting and crystallizing the amorphous semiconductor film to form a crystalline semiconductor film;

forming a first gate insulating film that is in contact with the crystalline semiconductor film;

forming an electric charge accumulating layer on the first gate insulating film;

forming a second gate insulating film on the electric charge accumulating layer; and forming a control gate electrode on the second gate insulating film.

2. A method of manufacturing a semiconductor memory cell according to claim 1, wherein the semiconductor memory cell is incorporated in at least one selected from the group consisting of a game machine, a video camera, a digital camera, a head-mounted display, a DVD player, a personal computer, a cellular phone, and an audio system.

3. A method of manufacturing a semiconductor memory cell comprising:

forming a plurality of insulating films so that at least one linear concave portion is formed over a substrate having an insulating surface;

forming an amorphous semiconductor film in a region that includes the at least one linear concave portion;

melting and crystallizing the amorphous semiconductor film to form a crystalline semiconductor film by irradiating the amorphous semiconductor film with a laser light;

forming a first gate insulating film that is in contact with the crystalline semiconductor film;

forming an electric charge accumulating layer on the first gate insulating film;

forming a second gate insulating film on the electric charge accumulating layer; and forming a control gate electrode on the second gate insulating film.

4. A method of manufacturing a semiconductor memory cell according to claim 3, wherein the laser light is scanned along the at least one linear concave portion.

5. A method of manufacturing a semiconductor memory cell according to claim 3, wherein the semiconductor memory cell is incorporated in at least one selected from the group consisting of a game machine, a video camera, a digital camera, a head-mounted display, a DVD player, a personal computer, a cellular phone, and an audio system.

6. A method of manufacturing a semiconductor memory cell comprising:

forming a plurality of insulating films so that at least one linear concave portion is formed over a substrate having an insulating surface;

forming an amorphous semiconductor film in a region that includes the at least one linear concave portion;

melting and crystallizing the amorphous semiconductor film to form a crystalline semiconductor film;

etching a surface of the crystalline semiconductor film so that side surfaces of the crystalline semiconductor film are covered with side walls of the at least one linear concave portion;

forming a first gate insulating film that is in contact with the crystalline semiconductor film;

forming an electric charge accumulating layer on the first gate insulating film;

forming a second gate insulating film on the electric charge accumulating layer; and forming a control gate electrode on the second gate insulating film.

7. A method of manufacturing a semiconductor memory cell according to claim 6, wherein the semiconductor memory cell is incorporated in at least one selected from the group consisting of a game machine, a video camera, a digital camera, a head-mounted display, a DVD player, a personal computer, a cellular phone, and an audio system.

8. A method of manufacturing a semiconductor memory cell comprising:

forming a plurality of insulating films so that at least one linear concave portion is formed over a substrate having an insulating surface;

forming an amorphous semiconductor film in a region that includes the at least one linear concave portion;

melting and crystallizing the amorphous semiconductor film to form a crystalline semiconductor film by irradiating the amorphous semiconductor film with a laser light;

etching a surface of the crystalline semiconductor film so that side surfaces of the crystalline semiconductor film are covered with side walls of the at least one linear concave portion;

forming a first gate insulating film that is in contact with the crystalline semiconductor film;

forming an electric charge accumulating layer on the first gate insulating film;

forming a second gate insulating film on the electric charge accumulating layer; and forming a control gate electrode on the second gate insulating film.

9. A method of manufacturing a semiconductor memory cell according to claim 8, wherein the laser light is scanned along the at least one linear concave portion.

10. A method of manufacturing a semiconductor memory cell according to claim 8, wherein the semiconductor memory cell is incorporated in at least one selected from the group consisting of a game machine, a video camera, a digital camera, a head-mounted display, a DVD player, a personal computer, a cellular phone, and an audio system.

11. A method of manufacturing a semiconductor memory cell comprising:

forming a plurality of insulating films so that at least one linear concave portion is formed over a substrate having an insulating surface;

forming an amorphous semiconductor film in a region that includes the at least one linear concave portion;

crystallizing the amorphous semiconductor film to form a crystalline semiconductor film;

forming a first gate insulating film that is in contact with the crystalline semiconductor film;

forming an electric charge accumulating layer on the first gate insulating film;

forming a second gate insulating film on the electric charge accumulating layer; and forming a control gate electrode on the second gate insulating film.

12. A method of manufacturing a semiconductor memory cell according to claim 11, wherein the semiconductor memory cell is incorporated in at least one selected from the group consisting of a game machine, a video camera, a digital camera, a head-mounted display, a DVD player, a personal computer, a cellular phone, and an audio system.

13. A method of manufacturing a semiconductor memory cell comprising:

forming a plurality of insulating films so that at least one linear concave portion is formed over a substrate having an insulating surface;

forming an amorphous semiconductor film in a region that includes the at least one linear concave portion;

crystallizing the amorphous semiconductor film to form a crystalline semiconductor film;

etching a surface of the crystalline semiconductor film so that side surfaces of the crystalline semiconductor film are covered with side walls of the at least one linear concave portion;

forming a first gate insulating film that is in contact with the crystalline semiconductor film;

forming an electric charge accumulating layer on the first gate insulating film;

forming a second gate insulating film on the electric charge accumulating layer; and forming a control gate electrode on the second gate insulating film.

14. A method of manufacturing a semiconductor memory cell according to claim 13, wherein the semiconductor memory cell is incorporated in at least one selected from the group consisting of a game machine, a video camera, a digital camera, a head-mounted display, a DVD player, a personal computer, a cellular phone, and an audio system.

15. A method of manufacturing a semiconductor memory cell comprising:

forming a plurality of stripes comprising an insulating material over a substrate having an insulating surface;

forming an amorphous semiconductor film in a region between the plurality of stripes;

crystallizing the amorphous semiconductor film to form a crystalline semiconductor film;

forming a first gate insulating film that is in contact with the crystalline semiconductor film;

forming an electric charge accumulating layer on the first gate insulating film;

forming a second gate insulating film on the electric charge accumulating layer; and forming a control gate electrode on the second gate insulating film.

16. A method of manufacturing a semiconductor memory cell according to claim 15, wherein the semiconductor memory cell is incorporated in at least one selected from the group consisting of a game machine, a video camera, a digital camera, a head-mounted display, a DVD player, a personal computer, a cellular phone, and an audio system.

17. A method of manufacturing a semiconductor memory cell comprising:

forming a plurality of stripes comprising an insulating material over a substrate having an insulating surface;

forming an amorphous semiconductor film in a region between the plurality of stripes;

crystallizing the amorphous semiconductor film to form a crystalline semiconductor film;

etching a surface of the crystalline semiconductor film so that side surfaces of the crystalline semiconductor film are covered with side walls of the plurality of stripes;

forming a first gate insulating film that is in contact with the crystalline semiconductor film;

forming an electric charge accumulating layer on the first gate insulating film;

forming a second gate insulating film on the electric charge accumulating layer; and forming a control gate electrode on the second gate insulating film.

18. A method of manufacturing a semiconductor memory cell according to claim 17, wherein the semiconductor memory cell is incorporated in at least one selected from the group consisting of a game machine, a video camera, a digital camera, a head-mounted display, a DVD player, a personal computer, a cellular phone, and an audio system.

19. A method of manufacturing a semiconductor memory cell comprising:

forming at least two stripes comprising an insulating material over a substrate having an insulating surface;

forming an amorphous semiconductor film in a region between the at least two stripes;

crystallizing the amorphous semiconductor film to form a crystalline semiconductor film;

forming a first gate insulating film that is in contact with the crystalline semiconductor film;

forming an electric charge accumulating layer on the first gate insulating film;

forming a second gate insulating film on the electric charge accumulating layer; and forming a control gate electrode on the second gate insulating film.

20. A method of manufacturing a semiconductor memory cell according to claim 19, wherein the semiconductor memory cell is incorporated in at least one selected from the group consisting of a game machine, a video camera, a digital camera, a head-mounted display, a DVD player, a personal computer, a cellular phone, and an audio system.

21. A method of manufacturing a semiconductor memory cell comprising:

forming at least two stripes comprising an insulating material over a substrate having an insulating surface;

forming an amorphous semiconductor film in a region between the at least two stripes;

crystallizing the amorphous semiconductor film to form a crystalline semiconductor film;

etching a surface of the crystalline semiconductor film so that side surfaces of the crystalline semiconductor film are covered with side walls of the at least two stripes;

forming a first gate insulating film that is in contact with the crystalline semiconductor film;

forming an electric charge accumulating layer on the first gate insulating film;

forming a second gate insulating film on the electric charge accumulating layer; and forming a control gate electrode on the second gate insulating film.

22. A method of manufacturing a semiconductor memory cell according to claim 21, wherein the semiconductor memory cell is incorporated in at least one selected from the group consisting of a game machine, a video camera, a digital camera, a head-mounted display, a DVD player, a personal computer, a cellular phone, and an audio system.

* * * * *